(12) United States Patent
Amar et al.

(10) Patent No.: US 6,522,274 B1
(45) Date of Patent: Feb. 18, 2003

(54) USE OF POINTERS TO ENHANCE FLEXIBILITY OF SERIAL PORT INTERFACE FOR AN INTEGRATED CIRCUIT WITH PROGRAMMABLE COMPONENTS

(75) Inventors: Aryesh Amar, Nashua, NH (US); Jerome E. Johnston, Austin, TX (US); Donald Keith Coffey, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/321,583

(22) Filed: May 28, 1999

(51) Int. Cl.[7] .................................................. H03M 1/12
(52) U.S. Cl. ........................ 341/141; 341/155; 341/139
(58) Field of Search ................................ 341/141, 143, 341/155, 139

(56) References Cited

U.S. PATENT DOCUMENTS

| | | | | |
|---|---|---|---|---|
| 4,974,181 A | * | 11/1990 | Sinderson et al. | 364/550 |
| 5,172,116 A | * | 12/1992 | Noma | 341/141 |
| 5,291,197 A | * | 3/1994 | Abe | 341/141 |

OTHER PUBLICATIONS

Intersil Inc. Product Data Sheet for the H17188, Aug. 1997.*
Hogenauer, Eugene B. "An Economical Class of Digital Filters for Decimation and Interpolation." *IEEE Transactions on Acoustics, Speech and Signal Processing*, vol. ASSP–29, No. 2, Apr. 1981, pp. 155–162.

* cited by examiner

*Primary Examiner*—Howard L. Williams
(74) *Attorney, Agent, or Firm*—Dan Shifrin

(57) ABSTRACT

A method and apparatus are used to process a plurality of analog signals on a corresponding plurality of physical channels using a circuit having analog to digital converter (ADC) components, a serial port interface, and a serial port controller. Logical channel information for one or more logical channels is stored in a register on the serial port controller. Each logical channel specifies one of the physical channels and conversion information. Command bits are set over a serial port input pin, and include at least one pointer bit indicative of a selected logical channel. In response to the command bits, the serial port controller sends signals indicative of the physical channel and the converter property specified in the selected logical channel to the ADC components.

23 Claims, 16 Drawing Sheets

| D7(MSB) | D6 | D5 | D4 | D3 | D2 | D1 | D0 |
|---|---|---|---|---|---|---|---|
| CB | CSB2 | CSB1 | CSB0 | R/W̄ | RSB2 | RSB1 | RSB0 |

FIG. 3A

| BIT | NAME | VALUE | FUNCTION |
|---|---|---|---|
| D7 | Command Bit, CB | 0 | Must be logic 0 for these commands. See table 2. |
| | | 1 | |
| D6-D4 | Channel Select Bits, CSB2-CSB0 | 000 . . . 111 | CSB2-CSB0 provide the address of one of the eight physical channels. These bits are used to access the calibration registers associated with respective channels. Note: These bits are ignored when reading the data register. |
| D3 | Read/Write, R/W̄ | 0 | Write to selected register. |
| | | 1 | Read from selected register. |
| D2-D0 | Register Select Bit, RSB2-RSB0 | 000 | Reserved |
| | | 001 | Offset Register |
| | | 010 | Gain Register |
| | | 011 | Configuration Register |
| | | 100 | Conversion Data FIFO (read only) |
| | | 101 | Channel Set-up Registers |
| | | . . . | |
| | | 110 | Reserved |
| | | 111 | Reserved |

FIG. 3B

| D7(MSB) | D6 | D5 | D4 | D3 | D2 | D1 | D0 |
|---|---|---|---|---|---|---|---|
| CB | CPB3 | CPB2 | CPB1 | CPB0 | CC2 | CC1 | CC0 |

*FIG. 3C*

| BIT | NAME | VALUE | FUNCTION |
|---|---|---|---|
| D7 | Command Bit, CB | 0 | See table 1. |
|  |  | 1 | Must be logic 1 for these commands. |
| D6-D3 | Channel Pointer Bits, CPB3-CPB0 | 0000 . . 1111 | These bits are used as pointers to the logical channels. Note: The MC bit, must be logic 0 for these bits to take effect. When MC=1, these bits are ignored. The LP, MC, and RC bits in the configuration register are ignored during calibration. |
| D2-D0 | Conversion/Calibration Bits, CC2-CC0 | 000 | Normal Conversion |
|  |  | 001 | Self-Offset Calibration |
|  |  | 010 | Self-Gain Calibration |
|  |  | 011 | Reserved |
|  |  | 100 | Reserved |
|  |  | 101 | System-Offset Calibration |
|  |  | 110 | System-Gain Calibration |
|  |  | 111 | Reserved |

*FIG. 3D*

| D23(MSB) | D22 | D21 | D20 | D19 | D18 | D17 | D16 | D15 | D14 | D13 | D12 |
|---|---|---|---|---|---|---|---|---|---|---|---|
| A1 | A0 | CS2 | CS1 | CS0 | WR2 | WR1 | WR0 | G2 | G1 | G0 | U/B̄ |
| D11 | D10 | D9 | D8 | D7 | D6 | D5 | D4 | D3 | D2 | D1 | D0 |
| A1 | A0 | CS2 | CS1 | CS0 | WR2 | WR1 | WR0 | G2 | G1 | G0 | U/B̄ |

*FIG. 4A*

| BIT | NAME | VALUE | *R | FUNCTION |
|---|---|---|---|---|
| D23-D22/ D11-D10 | Latch Outputs, A1-A0 | 00 | R | Latch Output Pins A1-A0 Mimic D23/D11-D22/D10 register bits |
| D21-D19/ D9-D7 | Channel Select, CS2-CS0 | 000<br>001<br>010<br>011<br>100<br>101<br>110<br>111 |  | Select physical channel 1.<br>Select physical channel 2.<br>Select physical channel 3.<br>Select physical channel 4.<br>Select physical channel 5.<br>Select physical channel 6.<br>Select physical channel 7.<br>Select physical channel 8. |

*R indicates the bit value after the part is reset

*FIG. 4B-1*

| BIT | NAME | VALUE | | FUNCTION |
|---|---|---|---|---|
| D18-D16/<br>D6-D4 | Word Rate, WR2-WR0 | 000<br>001<br>010<br>011<br>100<br>101<br>110<br>111 | R | 15.0 Hz (2180 XIN cycles).<br>30.0 Hz (1092 XIN cycles).<br>61.6 Hz (532 XIN cycles).<br>84.5 Hz (388 XIN cycles).<br>101.1 Hz (324 XIN cycles).<br>1.88 Hz (17444 XIN cycles).<br>3.76 Hz (8724 XIN cycles).<br>7.51 Hz (4364 XIN cycles). |
| D15-D13/<br>D3-D1 | Gain Bits, G2-G0 | 000<br>001<br>010<br>011<br>100<br>101<br>110<br>111 | R | 100 mV (assumes VREF Differential = 2.5V)<br>55 mV<br>25 mV<br>1.0 V<br>5.0 V<br>2.5 V<br>Not used.<br>Not used. |
| D12/D0 | Unipolar /Bipolar, U/$\overline{B}$ | 0<br>1 | R | Bipolar measurement mode.<br>Unipolar measurement mode. |

*R indicates the bit value after the part is reset

*FIG. 4B-2*

| D23(MSB) | D22 | D21 | D20 | D19 | D18 | D17 | D16 | D15 | D14 | D13 | D12 |
|---|---|---|---|---|---|---|---|---|---|---|---|
| NU | NU | CFS1 | CFS0 | NU | MC | LP | RC | DP3 | DP2 | DP1 | DP0 |

| D11 | D10 | D9 | D8 | D7 | D6 | D5 | D4 | D3 | D2 | D1 | D0 |
|---|---|---|---|---|---|---|---|---|---|---|---|
| PSS | PD | PS/$\overline{R}$ | LPM | RS | RV | OD | OF | NU | NU | NU | NU |

FIG. 5A

| BIT | NAME | VALUE | | FUNCTION |
|---|---|---|---|---|
| D23-D22 | Not Used, NU | 00 | R* | Must always be logic 0. |
| D21-D20 | Chop Frequency Select, CF31-CF30 | 00<br>01<br>10<br>11 | R | 256 Hz Amplifier chop frequency.<br>4,096 Hz Amplifier chop frequency.<br>16,384 Hz Amplifier chop frequency.<br>1,024 Hz Amplifier chop frequency. |
| D19 | Not Used, NU | 0 | R | Must always be logic 0. |
| D18 | Multiple Conversion, MC | 0<br>1 | R | Perform single channel conversions. MIC bit is ignored during calibrations. Perform multiple conversions on logical channels in the channel-setup register by issuing only one command with MSB = 1. |
| D17 | Loop, LP | 0<br>1 | R | Don't loop. LP bit is ignored during calibrations.<br>The conversions on the single channel (MC = 0) or multiple channels (MC = 1) are continuously performed. |

*R indicates the bit value after the part is reset

FIG. 5B-1

| BIT | NAME | VALUE | | FUNCTION |
|---|---|---|---|---|
| D16 | Read Convert, RC | 0 | R | Don't wait for user to finish reading data before starting new conversions. The RC bit is used in conjunction with the LP bit when the LP bit is set to logic1. If LP = 0, the RC bit is ignored. If LP = 1, the ADC waits for user to read data conversion(s) before converting again. The RC bit is ignored during calibrations. Refer to Calibration Protocol for details. |
| | | 1 | | |
| D15-D12 | Depth Pointer, DP3-DP0 | 0000 . 1111 | R | When writing or reading the CSRs, these bits (DP3-DP0) determine the number of CSR's to be accessed. They are also used to determine how many logical channels are converted when MC = 1 and command byte with its MSB = 1 si issued. Note that the CS5522 has two CSRs, the CS5524 has four CSRs, and the CS5528 has 8 CSRs. |
| D11 | Power Save Select, PSS | 0 | R | Standby Mode (Oscillator active, allows quick power-up), Sleep Mode (Oscillator inactive). |
| | | 1 | | |
| D10 | Pump Disable, PD | 0 | R | Charge Pump Enabled. For PD = 1, the CPD pin goes to a HI-Z output state. |
| | | 1 | | |
| D9 | Power Save/Run, PS/$\overline{R}$ | 0 | R | Run. Power Save. |
| | | 1 | | |
| D8 | Low Power Mode, LPM | 0 | R | Normal Mode. Reduced Power Mode. |
| | | 1 | | |
| D7 | Reset System, RS | 0 | R | Normal Operation. Activate a Reset cycle. To return to Normal Operation write bit to zero. |
| | | 1 | | |
| D6 | Reset Valid, RV | 0 | R | No reset has occurred or bit has been cleared (read only). Bit is set after a Valid Reset has occurred. (Cleared when read.) |
| | | 1 | | |

*R indicates the bit value after the part is reset

FIG. 5B-2

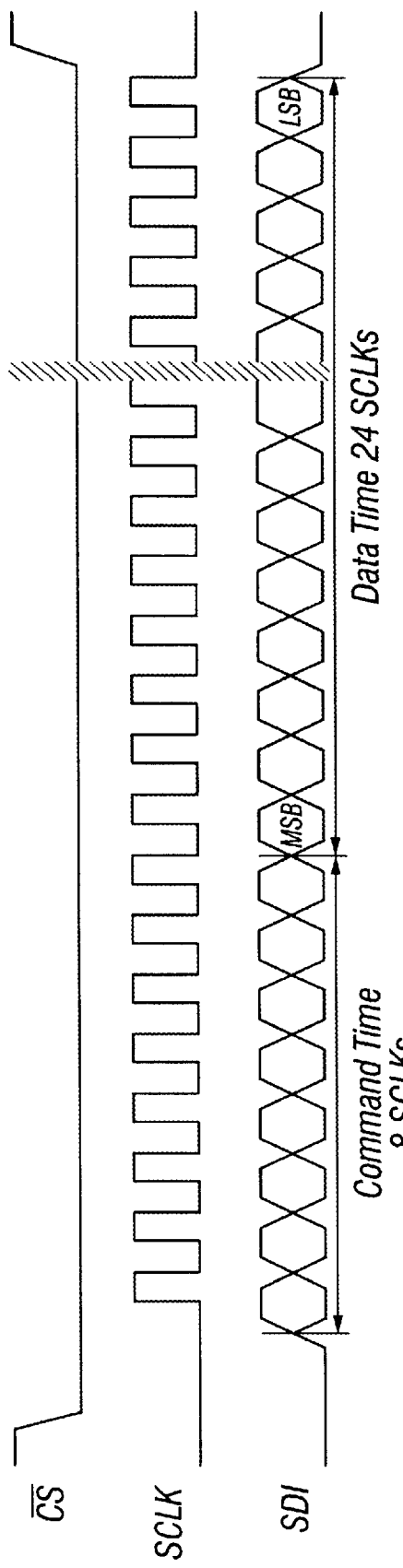

| BIT | NAME | VALUE | | FUNCTION |
|---|---|---|---|---|
| D5 | Oscillation Detect, OD | 0 | R | Bit is clear when an oscillation condition has not occurred (read only). |
| | | 1 | | Bit is set when an oscillatory condition is detected in the modulator. |
| D4 | Overrange Flag, OF | 0 | R | Bit is clear when an overrange condition has not occurred (read only). |
| | | 1 | | Bit is set when input signal is more positive than the positive full scale, more negative than zero (unipolar mode), or when the input is more negative than the negative full scale (bipolar mode). |
| D3-D0 | Not Used, NU | 0000 | R | Must always be logic 0. |

*R indicates the bit value after the part is reset

| Command bit # on SDI: 7 (=MSB) | FSM state: 0 | Operation on serial pins: user writes SDI |
|---|---|---|
| 6 | 1 | chip latches on SDI<br>user writes SDI |
| 5 | 2 | chip latches on SDI<br>user writes SDI |
| 4 | 3 | chip latches on SDI<br>user writes SDI |
| 3 | 4 | chip latches on SDI<br>user writes SDI |
| 2 | 5 | chip latches on SDI<br>user writes SDI |
| 1 | 6 | chip latches on SDI<br>user writes SDI |
| 0 | 7 | chip latches on SDI<br>user writes SDI |
|  | 8   16 | chip latches on SDI<br>c/u writes SDO/I |
|  | 9   17 | u/c latches on SDO/I<br>c/u writes SDO/I |

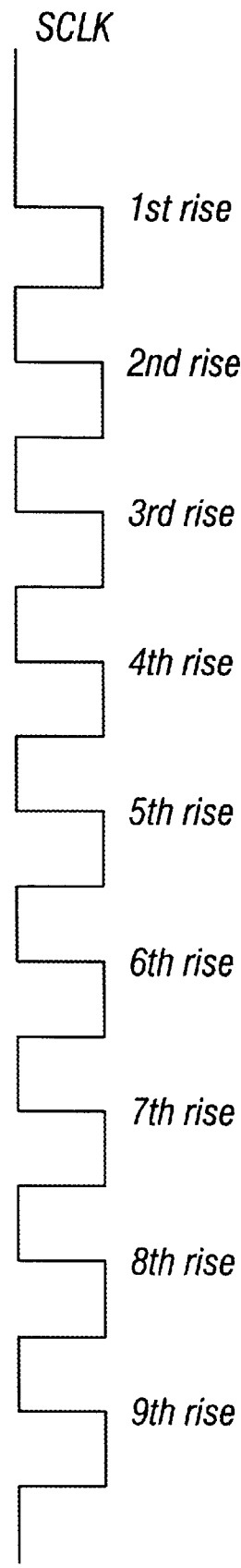

FIG. 9

USE OF POINTERS TO ENHANCE FLEXIBILITY OF SERIAL PORT INTERFACE FOR AN INTEGRATED CIRCUIT WITH PROGRAMMABLE COMPONENTS

CROSS-REFERENCE TO RELATED APPLICATIONS

This application is related to U.S. patent application Ser. No. 09/321,883, filed May 28, 1999, by inventors Aryesh Amar and Bruce Philip DelSignore, entitled "Techniques for Converting a Plurality of Channels Continuously in An A/D Converter".

FIELD OF THE INVENTION

The invention relates to analog to digital signal conversion techniques and more particularly to use of pointers to configure channels being converted.

BACKGROUND OF THE INVENTION

Techniques for sampling an analog signal, converting the sampled signal to digital and processing that signal using digital techniques are known in the art. An example of an analog signal source is that provided by a measurement sensor, such as a thermocouple or a strain gauge. Some techniques for sampling an analog signal use a rough buffer to precharge the sampling capacitor followed by a period of fine adjustment. The sampled analog signal is converted to digital. Conversion to digital may produce a digital stream of one or more bits.

Filters for doing such processing, such as FIR filters and FIR sinc filters are known. Some such filters use coefficients for multiplying digital values. Others, such as Hogenauer filters, described in an article by Eugene B. Hogenauer, entitled "AN ECONOMICAL CLASS OF DIGITAL FILTERS FOR DECIMATION AND INTERPOLATION," published in IEEE Transactions on Acoustics, Speech and Signal Processing, Volume ASSP-29, No. 2, April 1981, perform the filtering without coefficients.

Digital filters such as sinc filters can be implemented using digital circuits for performing a variety of mathematical operations. Multipliers are known which use 2's complement addition to perform multiplication. However, such multipliers require a fair amount of power, machine cycles and silicon real estate to implement.

Some signal processing circuits handle a plurality of channels. Parameters for one or more of such channels may be adjusted using gain and offset registers dedicated for that channel. Some measurement circuits such as those used for weigh scales require an adjustment so that a maximum digital output level corresponds to a calibrated full scale input signal value.

Some integrated circuits use signal processing circuits that can be programmed to set selectable characteristics, such as sampling rate and maximum input voltage. These properties are selected by issuing command signals that are applied to terminals connected to the circuit. Typically, such commands are issued to the circuit every time one of the selectable properties changes. During operation, the number and complexity of such commands issued can become significant.

It would be desirable to have a programmable analog to digital converter (ADC) which could handle a plurality of channels in a flexible way so that high volume conversion can be sustained. It would be further desirable for this flexibility to extend to sampling and converting a plurality of channels in any order, including more repetitions of one channel than another, the ability to sample the same channel at different times with different conversion characteristics, and the ability to skip converting some channels altogether. It would be particularly desirable if conversion properties could be selected flexibly and changed rapidly using fewer and simpler commands than in other signal processing circuits.

SUMMARY OF THE INVENTION

It is an object of the present invention to provide techniques to change combinations of physical channels and conversion properties during operation using a serial port simply and efficiently.

One aspect of the invention relates to a protocol for setting operating parameters for an analog to digital converter (ADC) circuit. The analog signals are converted to digital signals using a device having programmable ADC components that respond to signals indicative of conversion information over a serial port interface. Before operation begins, register content bits may be sent to the device on a serial input pin of the serial port interface. The register content bits include specifications for one or more logical channels. Each logical channel specifies one physical channel with which it is associated and a value for at least one variable ADC property. A plurality of commands can be sent on the serial input pin. Commands can indicate whether data conversion or channel calibration is to be performed. Each command also specifies a logical channel. Conversion or calibration is performed on the physical channel specified in the selected logical channel using the converter property or properties specified in that logical channel. This way a plurality of combinations of physical channel and conversion information can be specified indirectly, using relatively few pointer bits in the command, pointing to the information store in the logical channel register. Thus, reconfiguration of ADC properties for a particular channel can be made smaller, simpler and faster than by rewriting a full set of properties for a channel through the serial port.

DESCRIPTION OF DRAWINGS

The objects, features and advantages of the present invention will be apparent from the following description in which:

FIG. 3A is a logic representation of the Command Register of FIG. 2 when a command bit is 0.

FIG. 3B is a table showing the semantics of commands in the Command Register of FIG. 3A.

FIG. 3C is a logic representation of the Command Register of FIG. 2 when a Command Bit is 1.

FIG. 3D is a table showing the semantics of commands in the Command Register of FIG. 3C.

FIG. 4A is a block diagram of an exemplary register of the Channel Setup Registers of FIG. 2.

FIG. 4B is a table showing the semantics of bits in the Channel Setup Register of FIG. 4A.

FIG. 5A is a logic representation of the Configuration Register of FIG. 2.

FIG. 5B is a table showing the semantics of bits in the Configuration Register of FIG. 5A.

FIG. 6A is a time line showing voltage levels on the serial port interface pins during a write cycle.

FIG. 9 is a vertical time line showing the relationship of SCLK pulses to the Finite State Machine states and bit transfers involving serial port pins.

DESCRIPTION OF THE PREFERRED EMBODIMENT

The invention is designed to support data conversions which greatly increase the efficiency of the user command interface. This is accomplished through use of a combination of a group of setup registers and a serial port command structure. A serial port command byte contains several bits which are used as pointer bits to select a specific setup register among a group of setup registers. The contents of the setup register are previously entered with a particular set of selective options for performing a conversion. This arrangement enables a conversion control structure in which the user needs only to use a single byte command which contains a pointer that points to a register of greater length, which when decoded provides all the information needed for the converter to perform a conversion cycle using any of the available optional resources.

The setup register can be of any length, but the efficiency improvement occurs when the length of the setup registers is such that it contains significantly more information than that of a single serial port command byte. The setup register contains bits which are decoded to provide the converter with conversion options such as conversion rate, gain selection, unipolar/bipolar input span, selection of the physical input channel to be converted, and the state of digital logic output bits during conversion. Other options could be included in this command structure, such as whether a current source is turned on or off.

This architecture enhances the efficiency of the serial port interface because the information for performing a new conversion with a different set of parameters does not require that this information be conveyed to the converter each time a change in the parameters is made. Instead, all of the variations required by the user are preloaded into the setup registers when the system is initialized. During operation, the optional parameters used for conversions can be selected by the simplicity of a single byte serial port command which contains pointer bits to select the setup register which contains the proper options for a new conversion.

ADC Chip

Figure 1A:
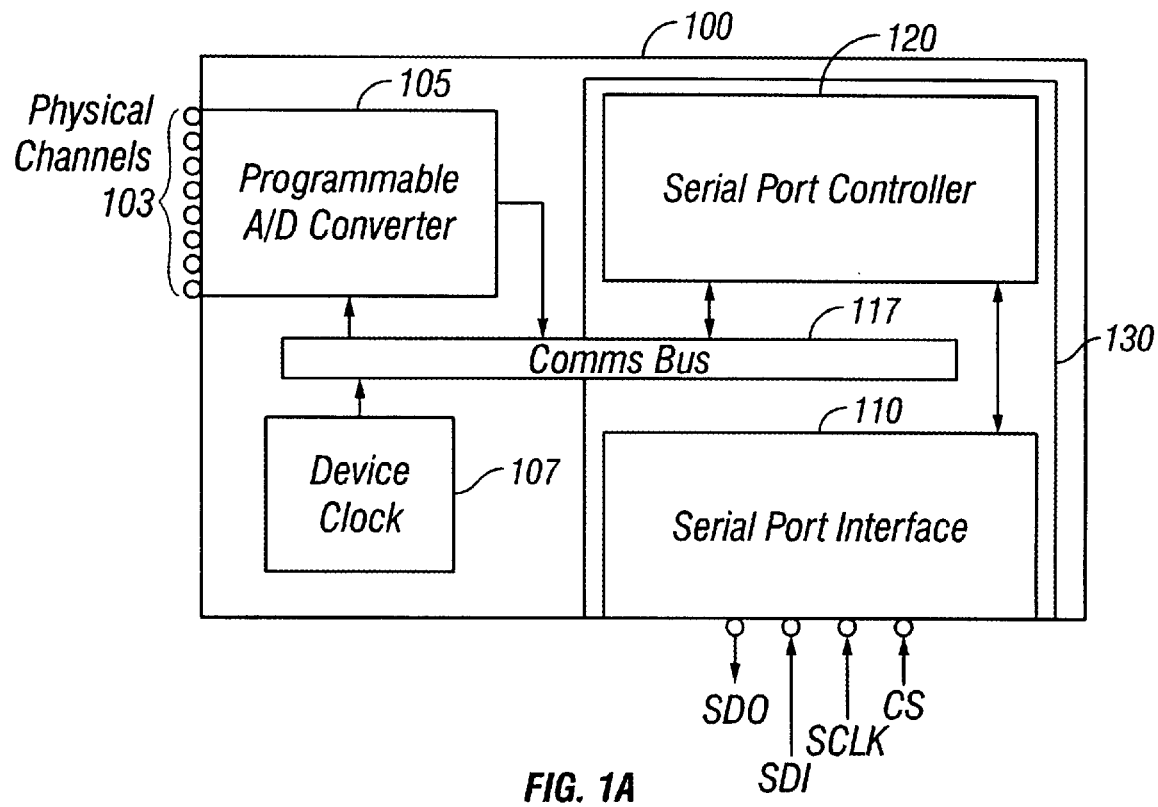
FIG. 1A is a block diagram of a programmable multichannel ADC according to the present invention.
Figure 1B:
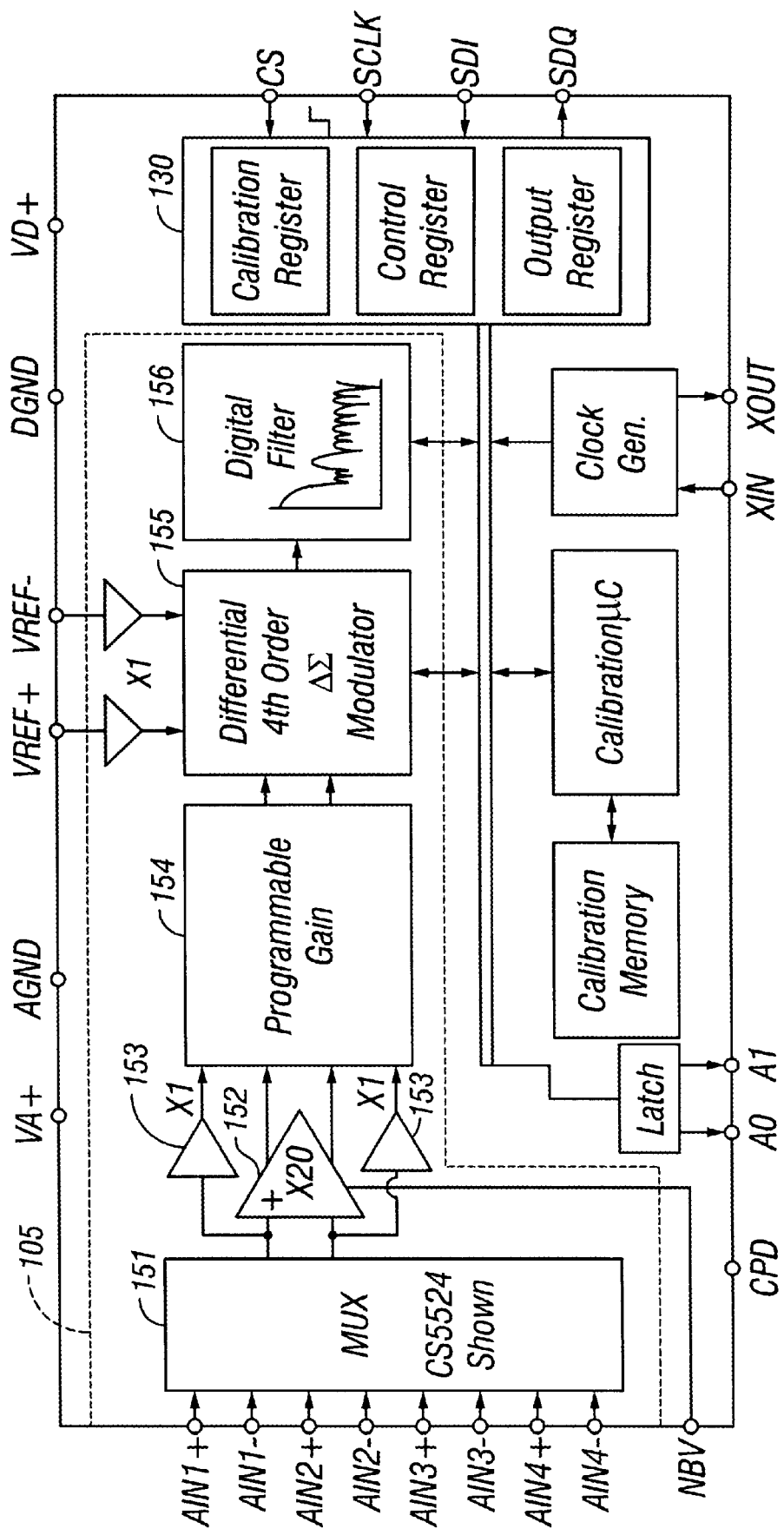
FIG. 1B is a block diagram of a exemplary embodiment of a multichannel ADC.

FIG. 1A is a block diagram of an exemplary integrated circuit chip in accordance with one aspect of the invention. At the left of FIG. 1A, a number of analogs input terminals 103 are shown as physical channels. Though eight channels are shown, the number of analog input terminals M, is a matter of design choice. In some versions of the chip, only 2 input pairs are used whereas in other implementations, 4 input pairs or more may be utilized. Programmable ADC components 105 is shown more in detail in FIG. 1B. Exemplary components of the programmable ADC include a multiplexer 151 which selects the particular input to be applied, a programmable instrumentation amplifier 154, a fourth order $\Delta\Sigma$ modulator 155 to convert analog signals into a series of one-bit outputs, and a programmable digital filter 156. In FIG. 1B, the Serial Port Controller 120 and serial port interface 110 are combined and represented as serial port 130.

The output of the programmable ADC 105 is a digital sample which can be communicated to devices external to the chip through a serial port interface 110 via an internal communications bus 117. Commands that select the characteristics of the programmable ADC components 105, can be input through the serial port interface 110 and communicated to the ADC 105 via the communications bus 117. A device clock 107 controls the synchronization of signals on the chip.

Serial Port Controller

A programmable channel sequencer, to control the sequence of conversions produced, is included in a Serial Port Controller 120 disposed between the serial port interface 110 and the communications bus 117. The purpose of the Serial Port Controller 120 is to interpret commands received at the Serial Port Interface using a protocol described more hereinafter and to generate signals that will control the programmable ADC components 105. The Serial Port Controller 120 also provides a repository for converted data from the ADC 105 until those data are output through the serial port interface 110. The details of the structure and function of the Serial Port Controller 120 are described further below.

As shown in FIG. 1A, the serial port interface 110 communicates with the Serial Port Controller 120 and is controlled thereby. The interface 110 includes four terminals labeled CS, SCLK, SDI, and SDO. Lines labeled CS, SCLK and SDI represent input terminals by which an external device such as a computer sends signals to the integrated circuit chip 100. Line SDO is a terminal by which signals from the chip 100 are sent to the external device. The interaction between the signals on the four terminals of the serial port interface 110 and the Serial Port Controller 120 will be described below in more detail.

Figure 2:
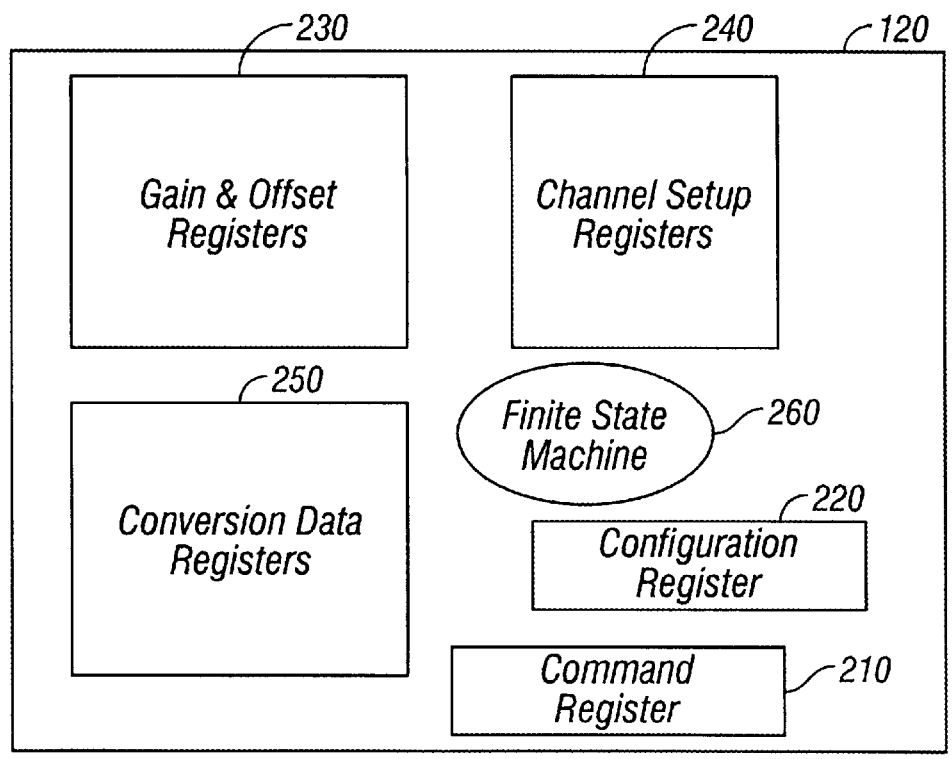
FIG. 2 is a block diagram of the Serial Port Controller of FIG. 1A, according to the exemplary embodiment of the present invention.

FIG. 2 is a block diagram showing portions of Serial Port Controller 120 in more detail. In this embodiment, the controller 120 includes a Configuration Register 220 and a set of Channel Setup Registers 240. The Controller 120 may also contain a Command Register 210 for holding commands received from the serial port interface on the SDI terminal. The Controller also may contain at least one gain and offset register associated with each of the physical channels 230. The controller 120 may also contain Conversion Data Registers 250, such as first in first out (FIFO) registers, which store digital samples output by the programmable ADC component 105.

As shown in FIG. 2, the Serial Port Controller contains a Command Register 210, a Configuration Register 220, and a set of Gain and Offset Registers 230, preferably, a combined gain register and offset register for each input channel. The Serial Port Controller 120 also acts as a programmable channel sequencer which can sequence the M physical channels programmed for use during a scan. A scan can be up to N choices long, where usually N≧M. The sequencer uses information from Channel Setup Registers 240 which contain information about the modes used when conversions are performed for every channel in the sequence. To compliment the sequencer, Conversion Data Registers 250 are included to store the output of up to N data conversions. In the preferred embodiment, N is equal to 2×M. In the exemplary embodiment, the Conversion Data Registers 250 are one or more first in first out (FIFO) registers used to store conversion words until the FIFO is read.

In exemplary embodiments described herein, the command register is taken to be 8 bits and all the other registers are 24 bits. The 8-bit command is sufficiently flexible to support desired functionality described herein. The use of more bits or fewer bits as a command size for the command register is simply a design choice that one of ordinary skill in the art can make. The 24 bits of the other registers are sufficient to provide 24-bit precision in the converted data. That is, the data word size is 24 bits in the preferred embodiment. Fewer total bits in the Channel Setup Registers 240 decreases the number of physical channels that can be pointed to, or decreases the flexibility in selecting conversion properties, or reduces the length of the sequence that can be specified for each scan, or some combination of these reductions.

In the preferred embodiment, the 8 bit command register is used to store the 8 bit command byte provided through the Serial Port Interface 110 using the protocol described below. The semantics of the command byte are indicated in FIGS. 3A through 3D, where the 8 bits are labeled from the least significant bit, D0, through the most significant bit, D7.

FIG. 3A gives mnemonic variable names for the command bits in the case where D7 is 0. FIG. 3B provides the full names, ranges of values, and functions associated with the bits of FIG. 3A. When the most significant bit, D7, of the command byte is 0, the Serial Port Controller 120 is notified that one of its registers should be read out to the serial port interface 110 (through pin SDO, as will be described below) or that one or more of its registers should have their contents replaced by the next bits input to the serial port interface 110 (through pin SDI, as will be described below).

As shown in FIGS. 3A and 3B, bits D6 through D4 provide the three channel select bits (CSB2, CSB1, CSB0) that can indicate up to 8 physical channels (binary 000 through 111). Bit D3 is the R/$\overline{W}$ bit, or write register bit, which indicates whether the indicated register is being read from or written to. The overbar herein corresponds to the overbar in the figures and indicates that a variable is active in the low state. In this instance, a low level state, 0, is associated with writing to a register, thus the terms "Write" and "W" have an overbar in FIGS. 3A and 3B, and in this written description. Bits D2 through D0 are the register select bits (RSB2, RSB1, RSB0) which indicate, in conjunction with the physical channel select bits when necessary, what register type in the Serial Port Controller 120 is being written to or read from. For example, when the RSBs have a value of 010, the gain register of one of the M physical channels is being indicated; the value of the CSBs indicates which of the physical channels the gain register belongs to. In this example, if the CSBs had a value of 111, the Serial Port Controller 120 would be notified that the gain register of the $8^{th}$ physical channel was to be written to or read from.

In FIG. 3B, the total size of the Channel Setup Registers is indicated as L*N bits long, where N was defined above as the maximum number of conversion choices in the sequence or scan. Here L is the number of bits needed to specify selectable conversion properties for each conversion in the sequence. In the preferred embodiment, N is 2*M where M is the number of physical channels, for example, M may be 2 or 4 or 8. In the preferred embodiment, L is 12 bits.

In FIG. 3B, it is indicated that the Conversion Data Registers 250 e.g. (FIFO) holding the converted data in the preferred embodiment are read only. This means that the user of the ADC device of the present invention can read from but can not write values to the Conversion Data Registers 250. This is because the chip itself writes the digital sample values to these registers as signals are converted; the user can only read these data through the serial port.

FIG. 3C gives mnemonic variable names for the command bits in the case where D7 is 1. FIG. 3D provides the full names, ranges of values, and functions associated with the bits of FIG. 3C. When the most significant bit, D7, of the command byte is 1, the Serial Port Controller 120 is notified to start one or more of the on-chip calibration or conversion functions.

As shown in FIGS. 3C and 3D, bits D2 through D0 provide the three Calibration/Conversion Bits (CC2, CC1, CC0) which are used to indicate which of the on chip functions is to be invoked. When the CC bits hold a binary value of 000, the chip begins converting analog signals to digital signals using some or all of the selectable properties stored in the channel Setup Registers 240 and in the Gain & Offset Registers 230.

According to one aspect of the present invention, which of the selectable conversion information to use on which physical channels and in which order are also user choices.

If the user chooses to perform a sequence of different conversions from analog signals on one or more physical channels, this can be done with the simple command byte already described and using the information stored in the registers 220, 230, 240 and 250 in the Serial Port Controller 120, according to the present invention, as will be described below.

If the user chooses to convert analog signals using different conversion options on a single physical channel, the user must indicate both the desired physical channel and associated conversion properties via the command byte. According to the present invention, the user can indicate both the physical channel and conversion options simply with the four Channel Pointer bits (CPB3 through CPB0) provided in command bits D6 through D3, by pointing to one of the up to N conversion choice sets (also called logical channels) already stored in the Channel Setup Registers 240. As will be shown below, each logical channel is a group of bits which can specify a physical channel and associated conversion information. So the present invention provides the advantage of great flexibility without great complexity or size in the command issued by the user to the Serial Port Interface 110. This might be useful in a two mode conversion during which, in one mode, a fast conversion at low resolution might be followed by a slower, but more accurate mode.

According to the present invention, the Channel Setup Registers 240 total L*N bits, where N is the maximum number of conversion choices (or logical channels) in any allowed scan or sequence, and L is the number of bits per conversion choice. In the preferred embodiment, L is 12, and two conversion choices are stored in each 24-bit register in the Channel Setup Registers 240. Since N=2*M for the preferred embodiment, where M is the number of physical channels on the chip, the Channel Setup Registers 240 include M 24 bit registers.

The semantics of the Channel Setup Registers are illustrated in FIGS. 4A and 4B, where D23 indicates the most significant bit in each 24-bit register and D0 indicates the least significant bit.

FIG. 4A gives mnemonic variable names for each channel setup register and FIG. 4B provides the full names, ranges of values, and functions associated with the bits of FIG. 4A. As shown in FIGS. 4A and 4B, bits D21 through D19 and bits D9 through D7 provide the three channel select bits in the setup registers (CS2, CS1, CS0) that can indicate up to 8 physical channels (binary 000 through 111) for the first and second logical channel in the register, respectively. Where the chip includes latch output pins as shown by items A1 and A0 in FIG. 1B, the values at those pins may be set to match bits D23 and D22, or D11 and D10, for a selected logical channel, for example, as a way to track the sequence of logical channels actually followed during chip operation. The primary use for the latch output pins is to control a multiplexer or other logical functions performed outside the converter chip 100. Any 2 bit command can be output through the latch pins.

The remaining bits in each logical channel indicate the selectable conversion properties to be associated with the physical channel indicated by the CS bits. In the preferred embodiment, up to eight selectable word rates may be indicated in the three Word Rate bits WR2–WR1 in positions D18 through D16 and D6 through D4 for the first and second logical channels in each register, respectively. Likewise, up to eight gain values can be indicated in the three Gain bits G2–G0 in positions D15 through D13 and D3 through D1 for the first and second logical channels in each register, respectively. Similarly, up to two polarity choices can be indicated in the one Unipolar/$\overline{\text{Bipolar}}$ bit, U/$\overline{\text{B}}$, positioned in D12 and D0 for the first and second logical channels in each register, respectively. Unipolar signals are voltage signals that vary to one side of a reference electrical potential, while bipolar signals may vary above and below the reference electrical potential.

The detailed information supplied in FIG. 4B for the functions associated with the selectable properties and latch output in each channel setup register is for the case when the programmable ADC components include those illustrated in FIG. 1B. In that case, there are 8 choices for word rate, expressed in units of 24 bit converted words per second. These word rates can also be specified as the number of internal oscillator cycles per 24 bit word, where the internal oscillator has a frequency, XIN, which is 32,768 Hertz (Hz) in the preferred embodiment. In that case, there are only 6 settings for the maximum input voltage range, i.e. the Gain Bits G2–G0, so two of the possible eight settings are not used.

Using other A/D programmable components with different programmable parameters and settings is a matter of design choice and is also contemplated by the current invention.

In the preferred embodiment, the 24 bit Configuration Register 220 is also used with Serial Port Controller 240 logic to control the operation of the Programmable ADC Components 105 and Serial Port Interface 110. The Configuration Register 220 is designed to hold information considered less likely to change between one use of the ADC chip 100 and the next. The semantics of the Configuration Register 220 are indicated in FIGS. 5A and 5B, where the 24 bits are labeled from the least significant bit, D0, through the most significant bit, D23.

FIG. 5A gives mnemonic variable names for the 24 configuration bits. As shown in FIGS. 5A and 5B for the preferred embodiment, bit D18 provides the multiple conversion bit, MC, that indicates whether conversion is to be performed on a sequence of more than one physical channel with one set of conversion information. If MC is set equal to a multichannel code, then multichannel processing is indicated. In the preferred embodiment the multichannel code is 1. Bit D17 provides the loop bit, LP, that indicates a sequence of one or more conversions is to be repeated continuously without further command bytes being presented to the serial port. Bit D16 provides the read convert bit, RC, which indicates that during continuous conversion, the next conversion should wait until the user has read the converted data in the Conversion Data Registers 250 from the previous conversions. Bits D15 through D12 provide the four bits of the depth pointer (DP), DP3–DP0, which indicates how many conversions are in the sequence, i.e. how many logical channels are needed to specify the scan. Since up to 16 conversions are allowed in a scan in the preferred embodiment, four bits are allowed for specifying DP. DP is zero to indicate the first logical channel, therefore the actual depth of the scan or sequence is given by A=DP+1. The depth stored in the DP bits must be less than or equal to N, the maximum number of conversions in a sequence allowed by the chip, i.e., A<=N. Consequently, when reading or writing the channel setup registers, the number of bits that need to be transferred is given by L*(A).

According to the present invention, a register accessible by the Serial Port controller, such as the Configuration Register 220, should contain the MC, LP and DP bits; their positions in the register, the other bits stored in the register, and the total size of the register are design considerations that may be modified for other purposes. The number of bits in DP can also be modified where a different number of physical channels or a different maximum sequence length is desired, as stated above.

In other embodiments, additional looping bits may be used and values in the looping bits Q greater than 1 can be used to signify that the number Q of scans should be produced. Alternatively, a number of scans can be related to Q without equaling Q. Naturally, a scan counter would be needed to keep track of the number of scans, and a computer would be used to determine when the number of scans returned equals the target indicated by Q. The extra bits storing Q can be placed in the configuration register or can be communicated in the command bits. Also, LP, MC and RC could be communicated in the command bits.

In the preferred embodiment, the Configuration Register 220 also includes a reset system bit, RS, e.g., at D7 and a reset valid bit, RV, e.g., at D6. At any time RS is set to 1, the system will be reset as described below. After a successful reset, RV is set to 1.

Conversion Method Using Serial Port Controller

The processing flow including the timing of bit arrival at the serial Port Interface 110 and the protocol for specifying channels, logical channel sequencing and continuous conversion will be described next using the example embodiment illustrated in FIG. 3A through FIG. 5B.

At startup of the preferred embodiment, the serial port logic is reset and RV is set to indicate that a valid reset occurred. After a reset, the on-chip registers are initialized to initial states and the Serial Port Controller 120 is placed in the command mode where it waits for a valid command. In hexadecimal notation, the configuration register is set to 000040, the offset registers are set to 000000, the gain registers are set to 400000, and the channel setup registers are set to 000000.

The serial port is initialized to the command mode whenever a power-on-reset is performed inside the converter, or when the user transmits the port initialization sequence. The port initialization sequence involves clocking 15 bytes of all 1 followed by one byte with the following bit contents "11111110". This sequence places the chip in the command mode where it waits for a valid command to be written.

In the preferred embodiment, after a reset, the RV bit is set until the Configuration Register 220 is read. The user must then write a logic 0 to the RS bit to take the part 100 out of reset mode.

According to the invention, the serial port has two modes of operation: the command mode and the data mode. After a system initialization or reset, the serial port is initialized into command mode where it waits to receive a valid command (e.g. the first 8-bits into the serial port). Once a valid command byte is received, the byte instructs the converter to read from or write to a register, perform a conversion or a calibration, or perform a NULL command. If a command other than start calibration or NULL command is received, the serial port enters data mode. In data mode, the registers are read from or written to. The number of bytes transferred depends on the type of register/FIFO being accessed and the way it is accessed. Once the data are transferred, the serial port either remains in data mode or returns to the command mode. The mode which is entered also depends on the status of bits in the Configuration Register 220.

It is noted here that typically a high logic level for a signal, e.g. SCLK, indicates that it has been asserted or activated, while a low logic level for the same signal indicates that it has been deasserted or deactivated. Conversely, if the signal is designated with an overscore, e.g. $\overline{CS}$, a low logic level indicates that the signal has been asserted or activated, and a high level indicates that it has been deasserted or deactivated. It is understood that signals may generally be made to be high level activating or low level activating without a change to the operation of the device, although a change to the structure of the device may be necessary. Similarly, signals that provide an indication by transitioning from a high to a low logic level may be altered to provide that indication by transitioning from a low to a high logic level. This is a design choice that does not generally affect the operation of the device.

The serial interface of the present invention consists of four control lines $\overline{CS}$, SCLK, SDI and SDO. $\overline{CS}$, Chip Select, is the control line which enables access to the serial port. If the CS pin is tied low, the port can function as a three-wire interface, since the chip is always accessible.

SCLK, Serial Clock, is the serial bit-clock which controls the shifting of data to or from the serial port. The $\overline{CS}$ pin must be held low (logic 0) before SCLK transitions can be recognized by the port logic of the processor in the Serial Port Controller 120.

SDI, Serial Data In, is the data signal used to transfer data to the converters.

SDO, Serial Data Out, is the data signal used to transfer output data from the converters. SDO falls to logic 0 anytime a calibration or conversion is completed. The SDO output will be held at high impedance any time $\overline{CS}$ is at logic 1.

The operation of the Serial Port during a write cycle following a command byte is depicted for the exemplary embodiment in FIG. 6A where voltage levels on the three input pins of the Serial Port Interface 110 are shown as a function of time. The user must set the $\overline{CS}$ pin low. Assuming the reset bit has occurred, the port is in the command mode. During the first 8 SCLK transition signals after $\overline{CS}$ is set low, bits of the command byte are transferred to the chip 100. For a write to occur, the command byte must include a logical 0 in the command bit, CB, for example in D7 as shown in FIG. 3B, and the R/$\overline{W}$ bit must be a logical 0 to indicate writing. If, for example, the Configuration Register 220 is to be written, the RSBs in the command byte should so indicate, e.g., with "011" in bits D2–D0, as shown in FIG. 3B. This puts the serial port into the data mode and signals the chip 100 that the next 24 bits transferred on the next 24 SCLK pulses are to be placed into the Configuration Register 220 from the most significant bit, D23, to the least, D0. In other embodiments, the bits can be transferred in a different order. Also, the serial port chip returns to the command mode. After transfer of the 24 bits, the user may set the $\overline{CS}$ pin to logical 1 as shown.

Figure 6B:
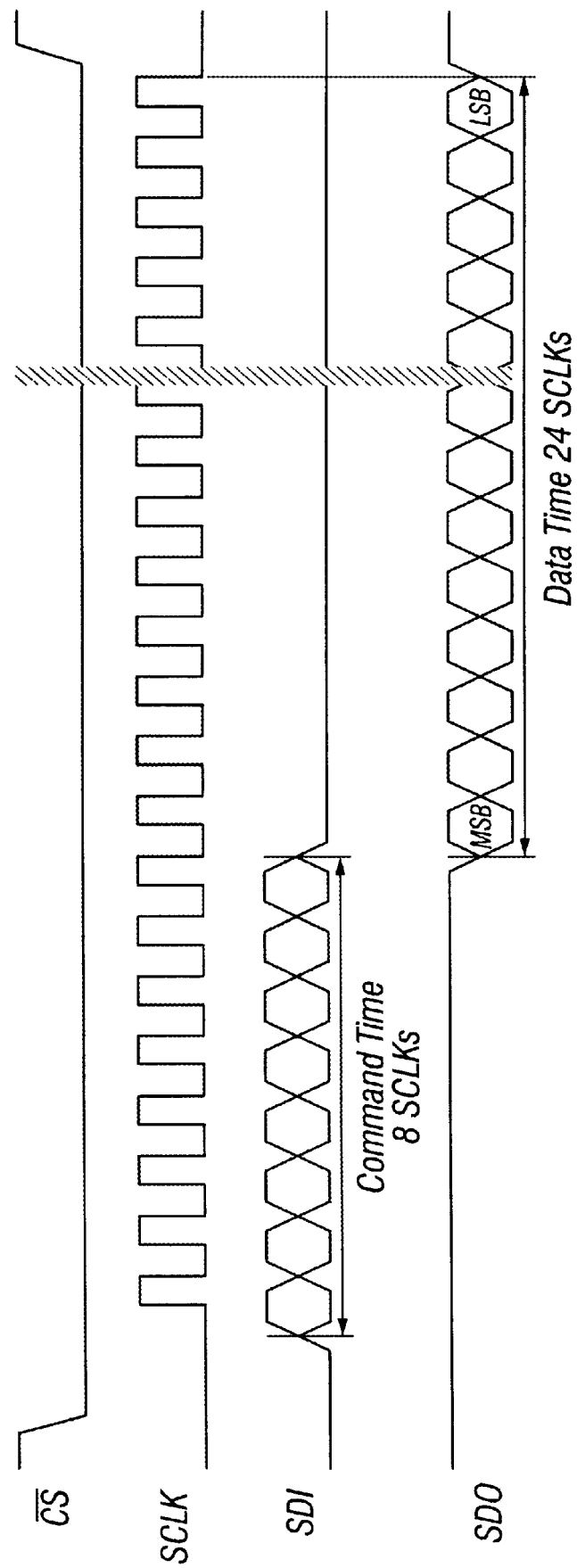
FIG. 6B is a time line showing voltage levels on the serial port interface pins during a read cycle.

The operation of the serial port during reads is shown in FIGS. 6B for reading from a 24-bit, one word register (e.g., 220, 230 or 240), and during conversion is shown in 6C for reading from the Conversion Data Registers 250 for the preferred embodiment where voltage levels on the pins of the Serial Port Interface 110 are shown as a function of time.

As shown in 6B, the user must set the $\overline{CS}$ pin low so that the chip responds to clock pulses sent on the SCLK pin. Assuming the reset has occurred, the port is in the command mode. During the first 8 SCLK transitions signal after the $\overline{CS}$ is set low, bits of the command byte are transferred to the chip 100. During transfer of the command bits, the SDO pin is set by the chip 100 at a high voltage level. On the next 24 SCLK pulses delivered by the user, the 24 bits from the register being read are output to the SDO pin.

As shown in 6C, when the command byte is a conversion command, e.g. CB="1" in location D7 and CC bits="000" in locations D2–D0, the controller is in the conversion mode, and the time chart is different. The serial port enters data mode as soon as the command is issued; and further pulses on the SCLK pin will not be used to read in additional command bits. During conversion, the chip must have time to perform the A/D conversion such as amplifying, decimating, interpolating, filtering and transferring the signals within the chip before the bits from the Conversion Data Registers 250 can be output to the SDO pin of the Serial Port Interface 110. This delay time, $t_d$, depends on the output word rate selected by the user in the Channel Setup Registers 240. Since the sample rates are relatively low, e.g., 100 Hz or less, compared to either the internal clock, e.g., XIN=32,768 Hz, or the serial port clock, e.g., $10^6$ Hz, $t_d$ can be a substantial number of cycles of either clock. While the conversion is taking place, the SDO pin is set by the chip at a high voltage level, and serial clock pulses should not be issued to the SCLK pin.

Figure 6C:
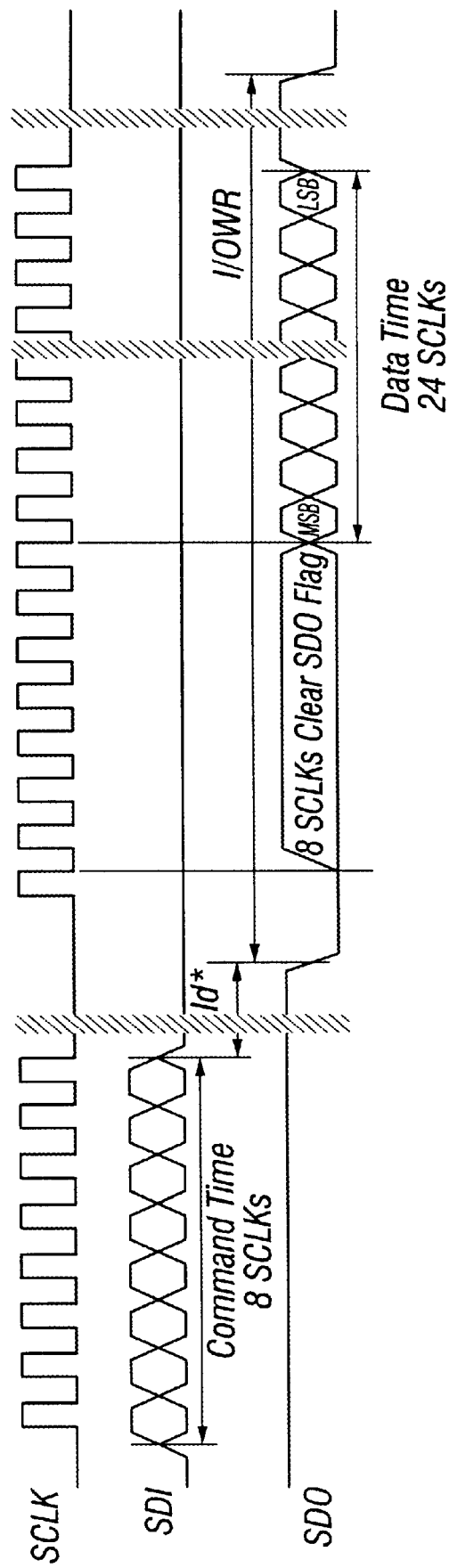
FIG. 6C is a time line showing voltage levels on the serial port interface pins during a conversion cycle.

After the SDO pin level drops signaling conversion is complete, the next 8 SCLK pulses are reserved for clearing the SDO flags, or data flag, during which the chip looks at the SDI pin for an exit flag containing an exit code or signals to repeat conversion, in circumstances described further below. That is, the flag size, i.e., the number of flag bits, is 8 in the preferred embodiment. The next SCLK clocks return the bits from the relevant registers of the Conversion Data Registers 250. If one channel was converted, then one word, e.g., 24 bits, is returned one bit per SCLK, as shown in FIG. 6C. If several channels were converted, e.g., if the depth bits in the Configuration Register 220 indicate A, logical channels then A words are returned, e.g., A*24 bits, one bit per SCLK clock.

After the last bit of the last output word has been transferred, SDO returns to a high level until the next conversion, if any, is ready. The next conversion cannot be ready until one word rate period after the previous conversion was ready, as indicated in FIG. 6C by the inverse of the output word rate OWR.

In the preferred embodiments, each CSR contains two logical channels, each logical channel is programmed by the user to contain the address of a physical input channel to be converted, and the data conversion information to be used, such as: 1) state of the output latch pins, 2) output word rate, 3) gain range, and 4) polarity. A particular physical input channel can be represented in more than one logical channel with different output rates, gain ranges, and conversion modes. Once programmed, the CSRs act as a sequencer and determine the order in which conversions are performed. To program the CSRs, twelve bits are needed to configure each logical channel. For example, to configure CSR #2, on the third logical channel, bits 23 to 12 are set to indicate data conversion information. Logical channels are read and written two at a time in the preferred embodiment. This means, while reading/writing CSRs, only an even number of logical channels are accessed. For similar reasons, in the preferred embodiment, the depth bits in the configuration register are only set to: 0001, 0011, 0101, 0111, 1001, 1011, 1101, 1111 for accessing CSRs.

To acquire single or multiple conversions, a command byte is issued with its command bit, CB, e.g., its most significant bit (MSB)=1 and CC2–CC0="000". This places the controller in conversion mode. The type of conversions performed and the way to access the resulting data are determined by the MC (multiple conversion), the LP (loop) and the RC (read convert) bits in the Configuration Register 220. The uses for these bits are described below.

When MC=0 and LP=0, based on the information provided in the Channel Set Up Registers 240, a single conversion is performed on the physical channel referenced by the logical channel. That is LP is equal to the single scan code, where the single scan code is 0 in the preferred embodiment. The command byte contains the pointer address of the logical channel to be used during the conversion embedded in it. The serial port enters data mode as soon as the 8-bit command byte to start a conversion is issued. The port remains in data mode during conversion. Upon the completion of the conversion, SDO falls to logic 0. Eight SCLKs are used to clear the SDO Flag. The next 24 are needed to read the conversion result. After reading the data, the serial port returns to the command mode, where it waits for a new command to be issued.

When MC=0 and LP=1 and RC=0, based on information contained in the Channel Setup Registers 240, a single channel conversion is repeatedly performed on the physical channel referenced by the logical channel. To get continuous conversion, LP is set equal to the continuous scan code. In the preferred embodiment the continuous scan code is 1; hence LP is here set equal to 1. The command byte contains the pointer address of the logical channel to be used during conversion. Once a conversion is complete, SDO fails to indicate that a conversion is ready. Thirty-two SCLKs are needed to acquire the conversion (which must be acquired before the next sample is converted). The first 8 SCLKs are used to clear the SDO flag. The next 24 are needed to read the conversion result. If "00000000" is provided to SDI as the exit flag during the first 8 SCLKs when the SDO flag is cleared, the converter remains in this conversion mode and continues to convert the selected channel. While in this mode, the user may choose to acquire only he conversions required for his or her application as SDO rises and falls to indicate the availability of a new conversion. To exit this conversion mode the user must provide the exit code "11111111" to the SDI pin as an exit flag during the first 8 SCLKs. If the user decides to exit, 24 SCLKs are required to clock out the last conversion before the converter will return to the command mode. From these two examples it is clear that the quantity of data words produced is responsive to the value of the LP bit.

When MC=0 and LP=1 and RC=1, based on information provided in the Channel Setup Registers 240, a single conversion is performed repeatedly on the physical channel referenced by the logical channel as above. However, conversion of the following scan may be delayed until the conversion data have been read. The command byte contains the pointer address of the logical channel to be used during the conversion embedded in it. After a conversion cycle is complete, SDO falls and the serial port is placed in the data mode where it will remain until the conversion data is read. If the user doesn't read the conversion word the converter stops performing new conversions and SDO will remain low until the conversion data is acquired. To acquire the conversion data, thirty-two SCLKs are needed. The first 8 SCLK are used to clear the SDO flag. The next 24 are needed to read the conversion result. If "00000000" is provided to SDI during the first 8 SCLKs used to clear the SDO flag, a new conversion cycle will be started after the conversion data is read. To exit this conversion mode and return to the command mode, the user must provide '11111111' to the SDI during the first 8 SCLKs. A final 24 SCLKs are required to clock out the last conversion data word.

When MC=1 and LP=0, based on information provided in the Channel Setup Registers 240, multiple conversions are performed once on the physical channels referenced by the logical channels of the CSRs. To get multichannel conversions, the multichannel bit is set equal to the multichannel code. In the preferred embodiment the multichannel code is 1. The first two conversions are based on the information in the channel-setup register (CSR) #1 (logical channels one and two); the third and fourth conversions are based on information in the CSR #2 (logical channels three and four); and so on up to N conversions. That is, the logical channels are used in order of their unique address in the registers. Here the order is of increasing address, but the order could be according to decreasing address. Alternatively a present order could be stored in another register. The depth (DP3–DP0) information bits in the configuration register determine how many conversions are performed in the single scan and hence must be initialized before this conversion mode is entered. Upon completion of the conversions, SDO falls to indicate that the conversion data set is ready to be read. To read the conversions from the conversion data FIFO, the user must first issue 8 SCLKs to clear the SDO flag. To read the conversions, the user must then supply 24×(A) SCLKs. A is defined as the number of logical channels being converted during one scan, which is the decimal equivalent of DP+1. For example, if DP3–DP0= "0010", A=(2+1)=3. To return to the command mode, the user must read all the conversion data from the FIFO because the serial port remains in data mode during the conversions and during the read of the data. Whether '00000000' or '11111111' is provided to the SDI during the 8 CLKs needed to clear the SDO flag, the serial port returns to the command mode after the conversion data FIFO is read.

When MC=1 and LP=1 and RC=0, based on information provided in the CSRs 240, multiple conversions on each scan are repeatedly performed on the physical channels referenced by the logical channels of the CDRs. Conversion of the next scan will not be delayed until the conversion data have been read. This conversion mode is similar to the conversion mode when MC=1, and LP=0. Once a conversion data set is converted the conversions are stored in the conversion data FIFO. The only difference is that the converter then returns to the top of the CDRs (i.e. to logical channel one of CSR #1) and repeats. As before, SDO falls to indicate when a data scan is complete. Once SDO falls, the user has three options: 1) exit after reading the conversion data FIFO; this is accomplished by providing SDI "111111" during the first 8 SCLKs and then giving 24×A more SCLKs to acquire the conversion data; 2) provide no SCLKs and remain in this mode without reading the data; in this case, SDO rises and falls once a new scan of conversions is complete to indicate that a new scan of data is ready to acquire; or 3) read the conversion data FIFO and remain in this mode; this is accomplished by providing SDI with "00000000" during the first 8 SCLKs and then giving 24×A more SCLKs to read the conversion data; the user must finish reading the FIFO before the first logical channel CSR #1 finishes a new conversion. From these last tow examples it is clear that the quantity of scans produced is responsive to the value of the LP bits.

When MC=1 and LP=1 and RC=1, based on information provided in the CSRs 240, multiple conversions on each scan are performed repeatedly on the logical channel of the CSR. Again, conversion of the next scan may be delayed until the conversion data have been read. This mode is similar to the conversion mode when MX=1, LP=1, and RC=0. The only difference is that the converter stops and waits for the conversion data FIFO to be emptied before new conversions are started. As before, SDO falls when a scan of data is complete. Once SD0 falls the user has two options: 1) exit after emptying the FIFO; this is accomplished by providing SDI "11111111" during the first 8 SCLKs and then giving 24×A more SCLKs to read the conversion data; or 2) empty the conversion data FIFO and remain in this mode, this accomplished by providing SDI with '00000000' during the first 8 SCLKs and then giving 24×A more SCLKs to read the conversion data. After the FIFO is emptied, the converter returns to the top of the CSRs (i.e. to logical channel one of CSR#1) and repeats.

Finite State Machine

The Serial Port Controller 120 is configured to perform the functions described above and this behavior can be implemented using special purpose fixed logical circuitry or other structure, or using a programmable gate array, or using a general purpose processor programmed with instructions. In any case, the conversion-related protocols can be represented by a Finite State Machine 260 (FSM) shown as a component of the Serial Port Controller 120 in FIG. 2. To perform all the required functions, a six-bit, 40-state FSM 260 is preferable in which the states are labeled 0 through 39 (binary 000000) through 100111). The FSM 260 is set to zero (binary 000000) after the reset. The FSM increments at every pulse on the SCLK pin while $\overline{CS}$ remains at logical 0. At certain states, a check is made of the values in one or more bits in various other registers accessible to the FSM 260 through the Serial Port Controller 120, and a jump to a different state is made, depending on conditions represented by the values of those bits. A signal may be generated by the FSM 260 at certain states. According to the exemplary embodiment, the states where such jumping or branching may occur are 7, 15, 31 and 39.

Figure 7:
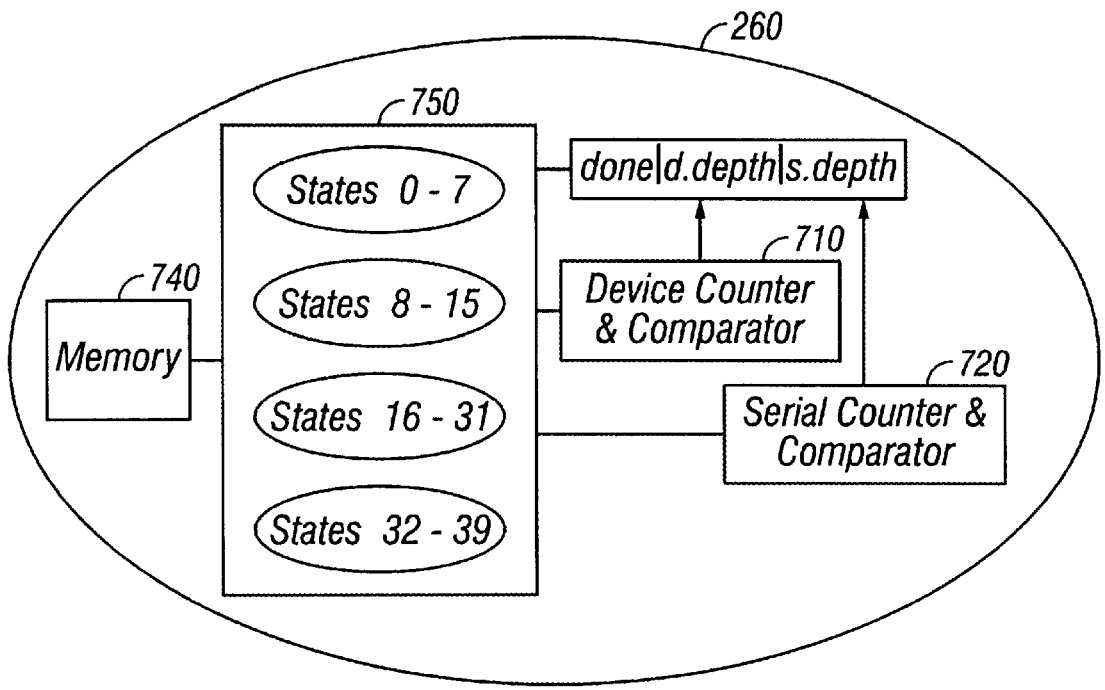
FIG. 7 is a block diagram of an exemplary Finite State Machine of FIG. 2 according to the one embodiment of the present invention.

FIG. 7 depicts a FSM 260 according to the present invention. In FIG. 7, the FSM 260 is represented by four bubbled, each representing a set of monotonic increases in state from a entry state, where the bubble is entered to a branching state where branching can occur; the four bubbles shown are for states 0–7, 8–15, 16–31 and 32–39, respectively. The first bubble represents the command mode; the second bubble represents the clear SDO flag; and the third and fourth bubbles combined represent an inner loop. The memory 740 contains any instruction required to configure and processor 750 to behave as the FSM 260.

Also according to the present invention, three states of the FSM 260 generate special signals; state 8 generates a read register signal, read_reg; state 16 generates a load data register signal, ld_datareg; and state 31 generates a write register signal, write_reg. The generation is symbolized by "!" in FIGS. 8A through 8D. Different conditions in the chocked bits and the consequent branching are illustrated in the different FIGS. 8A through 8D.

As also shown in FIG. 7 as part of the FSM 260, are other bits 730 which include a done bit provided by the Programmable ADC components 105. The done bit is set to logical 1 at the first device clock pulse after a channel has been converted. The FSM 260 also includes a device counter and comparator 710 and a serial counter and comparator 720. The device counter counts the number of conversion words produced by the device since the device counter was last reset, and the serial counter counts the number of data conversion registers that have been read through the serial port since the serial counter was last reset. The device comparator compares the device counter to the depth pointer, DP3–DP0, in the configuration register on each pulse of the device clock. On the first device clock pulse after the device count is equal to the depth pointer, a d.depth bit is set to logical 1. Similarly, the serial comparator compares the serial counter to the depth pointer on each pulse of the serial clock. On the first serial clock pulse after the serial count is equal to the depth pointer, an s.depth bit is set to logical 1.

Figure 8A:
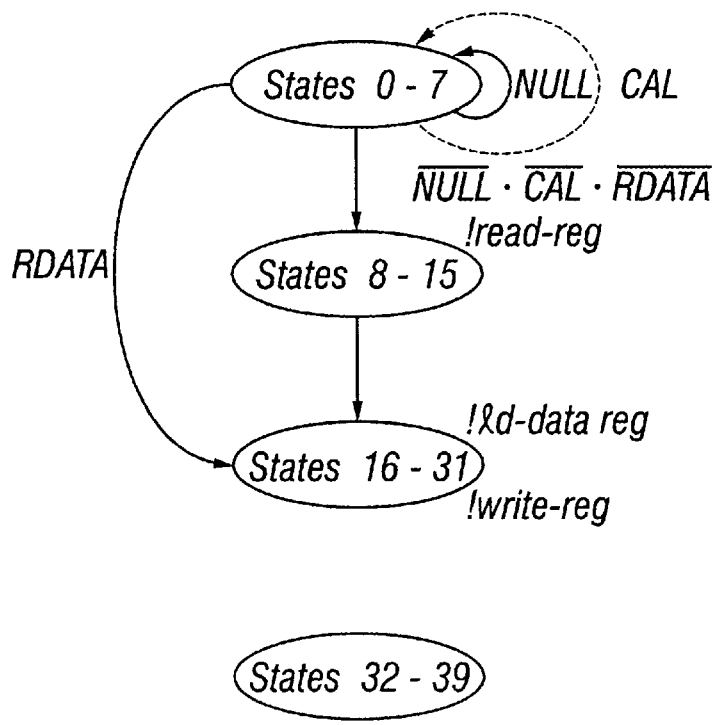
FIG. 8A is a state diagram for the Finite State Machine of FIG. 7 for an exemplary embodiment of the present invention depicting the command mode.

FIG. 8A depicts the process during command mode operations using the FSM 260. After reset, the FSM 260 is placed in state 0. At the rise of each pulse of the SCLK signal the FSM checks conditions and branches to the next state. The user reads a bit from the serial port pin SDO, or the chip reads a bit from pin SDI, also on each rising edge, because the pin value is stable at that time. At the fall of each pulse, the chip writes a bit to the serial SDO pin, or the user writes a bit to the SDI pin. The relationship between the rise and fall of each SCLK pulse and the FSM 260 state is illustrated in FIG. 9 for the command mode and first branch thereafter.

In FIG. 9 time advances downward, and the events coincident with the rising edge of each pulse are described with text immediately below the horizontal line aligned with the rise. Events above that line occur before that instant. FIG. 9 shows that a value is written to serial pins during a pulse falling edge by aligning the description of the write with the falling edge. In addition, FIG. 9 shows the command bit number written to the SDI pin during the command mode as a numeral from 7 (the most significant bit, MSB) to 0 (the least significant bit). As shown, each command bit is available on the SDI pin at some time before the next rising edge. At the instant of the rising edge, the voltage level on the SDI pin (or any serial pin) must be stable. FIG. 9 shows that, after state 7, the FSM 260 branches to either state 8 or 16, depending on conditions during the 8th rising edge. At that instant the least significant bit of the command mode, bit number 0, is available on the SDI pin and is latched on by the chip for determining branch conditions. At the first falling edge after the 8th rising edge either the chip writes to the SDO pin, or the user writes to the SDI pin (indicated in the figure by "c/u writes SDO/I"), depending on whether the command indicated a read or write or conversion. Similarly, at the 9th rising edge, the other entity latches on the written bit, i.e., either the user latches on to the value on the SDO pin written by the chip, or the chip latches on to the value of the SDI pin written by the user (indicated in the figure by "u/c latches on SDO/I"), depending on whether a read, write or conversion is occurring. Note that at the 9th rising edge in this example a command bit is not available on the SDI pin.

At the 8th rise of the SCLK clock, the last bit of the command byte is on the serial port, a check is made of conditions; and state 7 branches according to those conditions. Up through state 7, each bit read from the SDI pin is placed in a temporary register (not shown) of the FSM 260. So, when conditions are checked at the 8th rise, the FSM 260 uses bits in the temporary register, and on the SDI pin to branch in accordance with any controlling commands. Also during state 7, a load command signal is issued (not shown) so that, at the 8th rising edge, the 7 bits in the temporary register and the bit on the SDI pin are loaded into the Command Register 210. Thereafter, through state 39, the FSM uses bits in the Command Register 210 to branch according to any controlling commands. In the following discussion, the symbols used to represent conditions do not reflect whether the temporary register or the Command Register 210 is being used by the FSM. It is understood that at the branch out of state 7 the temporary register is used, and that at branches out of subsequent states the Command Register 210 is used.

On branching out of state 7, if the command is the null command (e.g., eight bits of logical 0), symbolized by the NULL condition, the serial port remains in the command mode and the FSM branches to state 0 waiting for the next 8 SCLK pulses to read the next command byte. If the command byte indicates the start of a calibration (e.g., CB in D7 is 1 and the CC bits in D2–D0 are greater than zero), symbolized by CAL, then calibration is performed, not shown, and the FSM 260 returns to state 0, indicated by the dashed line.

If the command is to read the data register (e.g., the CB in D7 is 0, the R/W in D3 is 1, and the RSBs in D2–D0 are "100"), this is represented symbolically by the condition RDATA, and the FSM 260 branches to state 16, as shown in FIG. 8A. At state 16, one word must be read for every logical channel in the sequence, e.g., 24*A bits must be read in the preferred embodiment (where A is the number of logical channels, and A=DP+1 where DP is the depth pointer value stored in Configuration Register). How the FSM handles entry state 16, is described later, below. At state 16, the serial port is in the data mode and the load data register signal is generated.

If the conditions when state 7 branches are not NULL, i.e. $\overline{\text{NULL}}$, not CAL, i.e., $\overline{\text{CAL}}$, and not RDATA, i.e., $\overline{\text{RDATA}}$, represented by the logical expression $\overline{\text{NULL}}*\overline{\text{CAL}}*\overline{\text{RDATA}}$, then a one word register, 24 bits in the preferred embodiment, is to be read or written, which is handled by entry state 8. At state 8, the serial port is also in the data mode, and a read register signal is asserted, as shown in FIG. 8A.

Figure 8B:
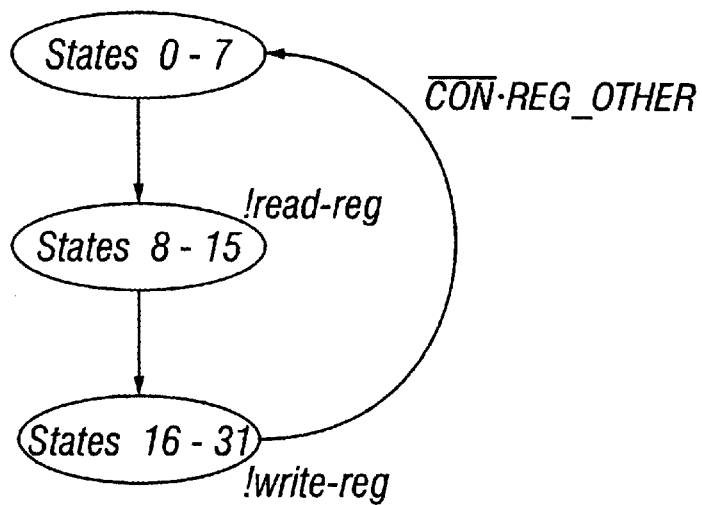
FIG. 8B is a state diagram of a portion of the Finite State Machine of FIG. 7 for the exemplary embodiment of the present invention depicting the data mode for registers that always comprise one word.

FIG. 8B shows the operation of the FSM 260 when the command is to read or write to a register only one word at a time, which is 24 bits in the preferred embodiment. In the following discussion the example of the preferred embodiment is used where the register word length is 24 bits and the important indicator bits occupy particular positions. It is understood that together word sizes and register sized and other bit locations can be used as a matter of design choice.

During the read of such a register, as described above, the FSM arrives at state 8. From state 8, the next branch out point is state 31, thus no branching out is done for the 24 serial clocks from state 8 through state 31 inclusive. This is indicated by the unconditional arrow from state 15 to state 16 in FIG. 8A. These 24 serial clocks allow one register to be read from the chip through SDO as shown in FIG. 6B. A read register signal is asserted at state 8 for a parallel process to start transferring bits from the register indicated in the Command Register 210 Register Select Bits (RSBs) and channel Select Bits (CSBs) to the SDO pin. Each bit is transferred from register to serial pin prior to the state change. Thus, the first bit is moved from register to serial port on the fall of the 8th pulse before state 8 branches on the 9th rise of the clock. Though a load data register is asserted at state 16, the signal has no consequence in this case.

Similarly, if the command is to write to one word register, 24 bits in the preferred embodiment, the FSM also arrives at state 8. The next 24 serial clock pulses occur without a branch. Because a read is not to be performed, the parallel process ignored the read register signal asserted at state 8. Each bit is transferred from the serial pin to a temporary register on the chip after each state change. Thus, the first bit is moved to the temporary register on the $9^{th}$ rise, as state 8 branches to state 9. A parallel process responds to the write register signal generated during state 31. On the branch out of state 31, after 23rd bit has transferred to the chip, and 24th bit is on the SDI pin, the bits in the indicated register are replaced with the bits in the temporary register and the bit on the SDI pin.

After reading or writing to a register which is always operated on one word at a time, the FSM returns to the command mode. The condition that a register is always written to or read from one word at a time, i.e., that the register is other than a Channel Setup Register 240 or a Conversion Data Register 250, can be indicated by the symbol REG_OTHER. As shown in FIG. 8B, the FSM 260 returns from state 31 to the command mode at state 0 if the FSM is not performing a conversion and the register is always a one-word-at-a-time register, i.e., when the condition is $\overline{\text{CON}}$ and REG_OTHER.

As described above, FIGS. 8A and 8B illustrate procedures that result from commands which leave the serial port in command mode or which read to or write from registers that always operate one word at a time.

If the command is to perform a conversion (e.g., the CB in D7 is 1 and the CC bits in D2–D0 are "000"), this condition is represented symbolically as CON.

Figure 8C:
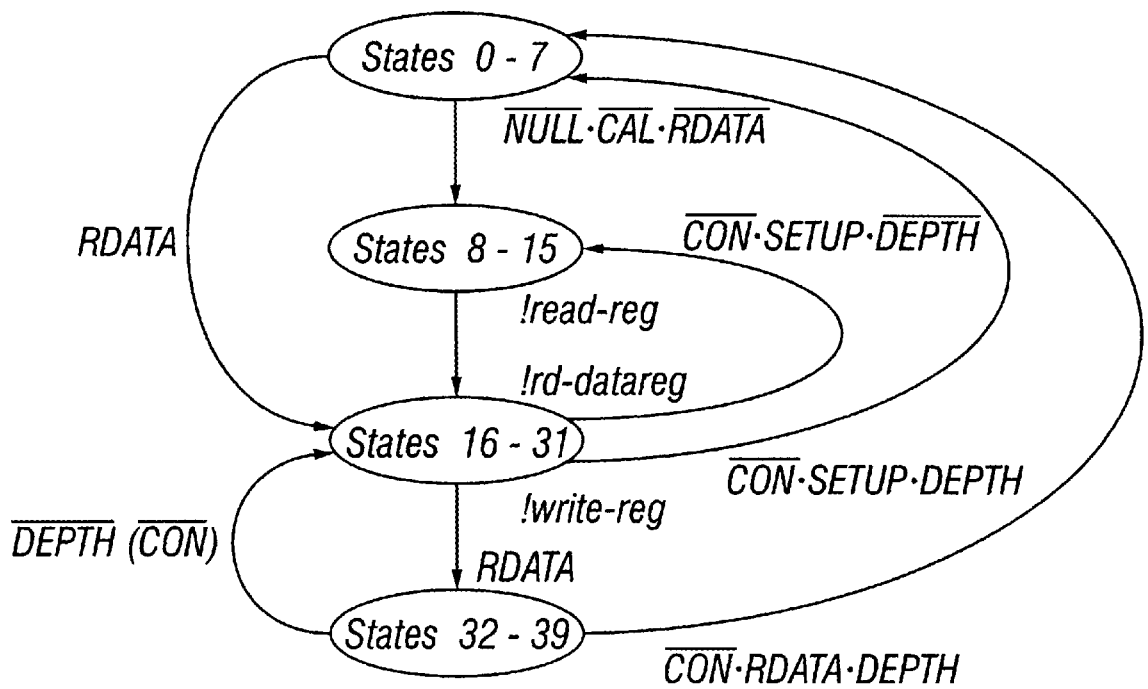
FIG. 8C is a state diagram of a portion of the Finite State Machine of FIG. 7 for the exemplary embodiment of the present invention depicting the data mode for registers that sometimes comprise more than one word.

FIG. 8C illustrates the procedure when a conversion is not performed but a multiple word read or write to registers is performed. In this case, the condition is $\overline{\text{CON}}$ and the registers are the Channel Setup Register 240, represented by SETUP, or the Conversion Data Registers 250, represented by RDATA (because only reads are allowed on the data registers through the serial port, RDATA serves as an indication that the Conversion Data Registers are being used). The registers being operated are known from the command bits which were read by the time the FSM 260 branches out of state 7. The number of words to read in these cases is the number of logical channels in the sequence or scan given by the depth pointer bits, e.g., DP3–DP0 in positions D15–D12 of the Configuration Register 220, as shown in FIG. 5B.

The DEPTH condition depicted in FIG. 8C symbolizes that the number of words read or written since the last command is equal to the depth of logical channels stored in the depth pointer bits of the configuration Register. $\overline{\text{DEPTH}}$ indicates that the number of words read or written is less than the depth of logical channels. The DEPTH condition can be determined using the Serial Counter and Comparator 720 depicted in FIG. 7. The serial counter can be set to zero when the FSM 260 is set to state zero, and the serial counter can count the number of read_reg signals issued at state 8 by the FSM during read operations or the number of write_reg signals asserted at state 31 by the FSM. At each serial clock pulse, the serial comparator can check whether the serial counter equals the depth. Since every 24 bit work represents two logical channels in the Channel Setup Registers 240, the counter should double its count before the comparison when SETUP is one of the conditions. When the count equals the depth, the s.depth bit is set to logical one. Thus the condition is DEPTH when s.depth is logical one. Clearly, if there is only one logical channel, i.e., depth is 1, then s.depth is 1 and the conditions include DEPTH after the first word is read or written.

When the Channel Setup Registers 240 are being read or written to, FSM state 7 branches to state 8 because the conditions are not NULL command, $\overline{\text{NULL}}$, and not calibration. $\overline{\text{CAL}}$, and not read Conversion Data Registers, $\overline{\text{RDATA}}$. A 24-bit word is transferred from state 8 through state 31 because no branching out occurs at state 15. On branching out of state 31, conditions are checked. Since this case is for no conversion, the conditions include $\overline{\text{CON}}$. The conditions also include SETUP. Thus the FSM 260 will branch to either state 8 where another 4 bit word start to be read or written in the data mode, or to state 0, the command mode. If all depth logical channels in a scan have been read or written, the condition is DEPTH and the FSM 260 branches to the command mode. If fewer than all logical channels have been read or write, the condition is $\overline{\text{DEPTH}}$ and the FSM branches to state 8, in the data mode, ready to transfer another 24-bit word.

When the conversion Data Registers 250 are to be read, FSM moves from state 7 to state 16 because the conditions include RDATA. At state 16 a load data register signal is issued which can be used by the Serial Counter and Comparator 720 to increment the serial counter. On branching out of state 31, only 16 bits have been read, but because the conditions still include RDATA, the FSM next steps to state 32 which continues to state 39, thus reading the last 8 bits of the word. On branching out of state 39, two paths are allowed when conversions are not being performed, i.e. with $\overline{\text{CON}}$ among the conditions (paths allowed with CON are discussed later). If one word has been read for every logical channel in the sequence, then the conditions include $\overline{\text{CON}}$ and RDATA and DEPTH, so the FSM shifts to state 0 where the serial port waits in command mode. If fewer than all logical channels have been read, then the conditions are $\overline{\text{CON}}$ and $\overline{\text{DEPTH}}$ and the FSM 260 goes to state 16, which is in the data mode, and transfers more data on the next SCLK pulses.

Figure 8D:
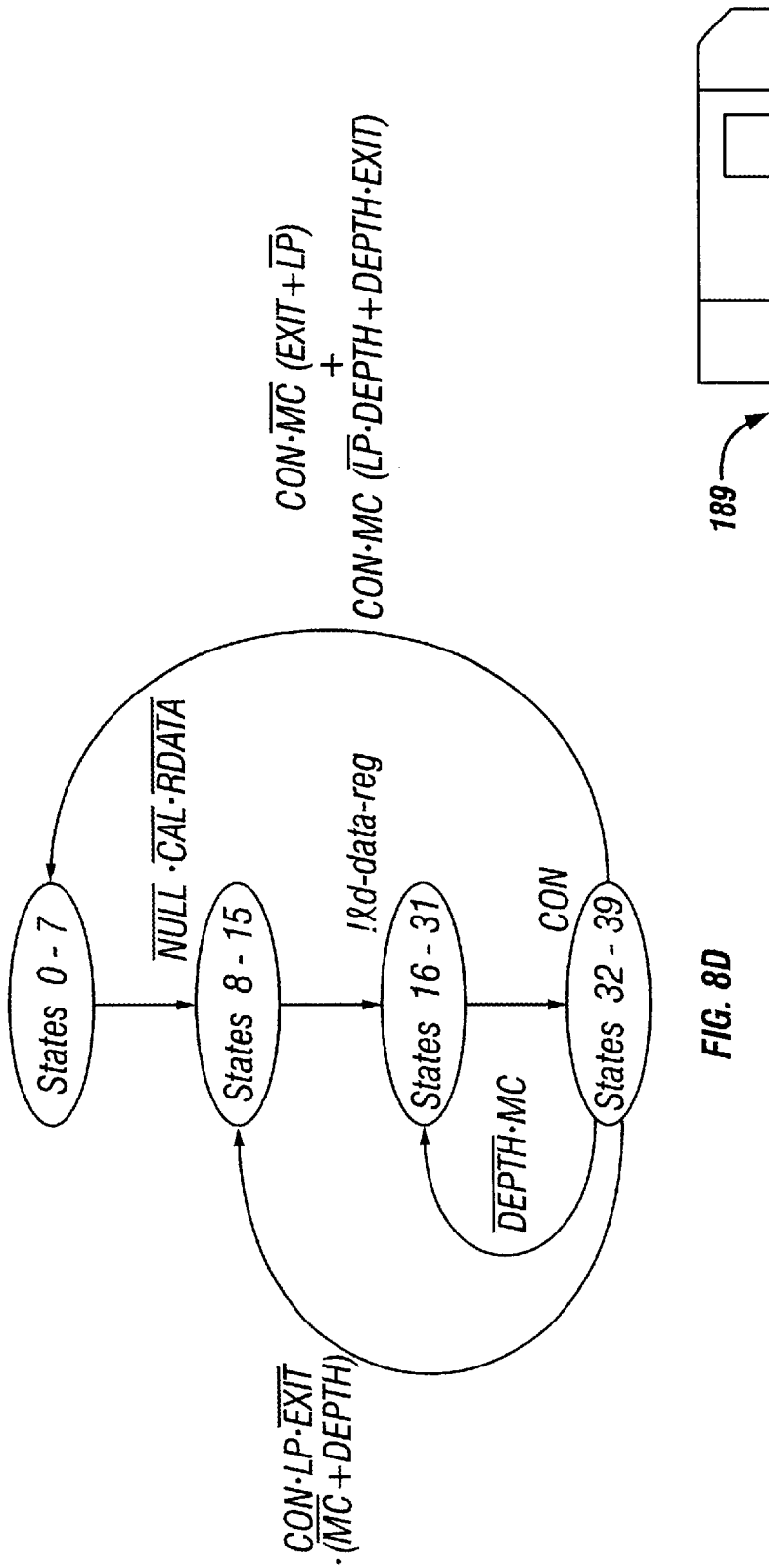
FIG. 8D is a state diagram of a portion of the Finite State Machine of FIG. 7 for the exemplary embodiment of the present invention depicting the command and data modes during conversions.

FIG. 8D illustrates the procedure when a conversion is performed so that the conditions include CON. A conversion is performed when thee is a logical 1 in the CB of the command byte and "000" in the CC bits, e.g., D7 and D2–D0, respectively, in the Command Register 219 of the preferred embodiment. In this case the conditions will depend on the values in the multiple Conversion bit, MC, the Loop bit, LP, and the Read Convert bit, RC, e.g., in D18, D17 and D16, respectively, of the preferred embodiment of the Configuration Register 220. In some situations the logical channel pointed to in the CPBs of the command byte, e.g., D6–D3 of the Command Register 219 in the preferred embodiment is also used. In some situations, the occurrence of an EXIT condition must be checked to accomplish the correct branching within the FSM 260. An EXIT condition occurs when the first eight bits on the SDI pin after SDO falls to low voltage are all logical 1, i.e. when the exit flag equals the exit code; otherwise the condition is $\overline{\text{EXIT}}$.

During conversion, the conditions upon branching out of state 7, after the command byte ha been read, include CON and also $\overline{\text{NULL}}$, $\overline{\text{CAL}}$ and $\overline{\text{RDATA}}$ so the FSM 260 is incremented to state 8. The 9th pulse, that causes branching out of state 8, should not be generated by the user until the SDO voltage drops from high to low indicating conversion is complete. By the time these next eight clocks are sent to the serial port, the FSM is branching out of state 15. These eight SCLK pulses clear the SDO flag, as shown in FIG. 6C. If all logical ones were presented at the SDI pin during these 8 clocks, then the conditions include EXIT, otherwise the conditions include $\overline{\text{EXIT}}$. The read register signal generated at state 8, and shown in FIGS. 8A, 8B and 8C, is ignored, so it is not shown in FIG. 8D. The FSM 260 moves unconditionally from state 15 to state 16.

During the next 16 serial clocks the FSM moving through state 31, during which 16 bits of the first converted word are read. At state 16 a signal is sent indicating a load of a data register is occurring, i.e. that a word is being transferred from the Conversion Data Registers 250 to the SDO pin of the serial port. The FSM 260 increments to state 32 on branching out of state 31 when performing conversions, i.e. when the conditions include CON, as shown in FIG. 8D. Thus the final 8 bits of the data register word is transferred on the next 8 serial clocks as the FSM is incremented through branching out of state 39.

With the last bit of a complete data word on the SDO pin, the FSM 260 branches out of state 39. Three paths are available for the next state. One returns the FSM to the command mode at state 0, the second returns the FSM to a data mode where a leading 8 bits are expected for clearing the SDO flag at state 8, and a third returns the FSM to a data mode where another 24 bit word is transferred at state 16 at the beginning of the inner loop. The conditions checked and the path taken depends on the values of MC, LP and RC.

When MC=0 and LP=0, does not matter what RC is. In this case, there is only one channel to be converted and it is not to be converted continuously. The one channel is the logical channel pointed to by the Channel Pointer Bits CPB, e.g., in positions D6–D3 of the command byte shown in FIG. 3D. After the one word is read, the FSM returns to the command mode at state 0 to wait for a new command. This condition is CON and $\overline{MC}$ and $\overline{LP}$, and is part of the condition expressed by the logical expression in FIG. 8D corresponding to "CON*$\overline{MC}$*(EXIT+$\overline{LP}$)" which should be read CON AND $\overline{MC}$ AND (either EXIT OR $\overline{LP}$).

The other part of that logical expression covers the case when MC=0 and LP=1. In this case, as in the case immediately above, only one channel is being converted, the logical channel indicated in the command byte. However, here that one channel is being converted continuously, that is, repeatedly without returning to the command mode. To bread out of this loop, there must be an EXIT condition when the FSM 260 branches out of state 39, after the word is read. Upon an EXIT condition, the FSM 260 returns to the command mode. That is, to return to state 0, the conditions must include CON and $\overline{MC}$ and EXIT. This is equivalent to the conditions for the case immediately preceding this case but with EXIT substituted for $\overline{LP}$. Since the condition occurs when either EXIT of $\overline{LP}$ is combined with both CON and $\overline{MC}$, the logical expression CON*$\overline{MC}$*(EXIT+$\overline{LP}$) shown in FIG. 8D results. This same path is followed when other conditions occur so these other expressions are also shown in FIG. 8D with another plus sign to indicate an inclusive OR logical operator.

When MC=0 and LP=1, i.e., when continuous conversion is being performed on one channel, but an exit condition has not been issued by the user, then the conditions are $\overline{MC}$, LP and $\overline{EXIT}$ when the FSM 260 branches out of state 39 into state 8. In this case the user is to wait for the next conversion to be done without issuing another command so the serial port remains in the data mode. The voltage on the SDO pin should rise until the conversion is performed then fall, setting the done bit in the FSM 260 shown in FIG. 7 at the next clock on the internal clock. No more SCLK pulses should be issued until the voltage level drops and the done bit is set. When this occurs, the FSM 260 is in a state where eight bits are used to clear the SDO flag. At state 8, the FSM 260 is in position to clear the eight bits of the SDO flag before reading the next work. Thus FIG. 8D shows that the FSM 260 moves from state 39 to state 8 when the conditions include CON*LP*$\overline{EXIT}$*($\overline{MS}$). (The same path is also followed when the conditions include DEPTH but not $\overline{MC}$, as is described below.)

When MC=1, then several logical channels must be converted on each scan, starting with the first logical channel at Channel Setup Registers 240 address 0, and ending with the logical channel pointed to by the depth pointer in the Configuration Register 220. For this example, let there be A logical channels to be converted in the sequence, where A<=N, and N is the maximum number of logical channels allowed in a sequence. In the preferred embodiment A is an even number. The address stored in the depth pointer bits in the Configuration Register 220 is then the binary representation of A1. When MC=1, the conditions include MC, otherwise the conditions include $\overline{MC}$.

When MC=1 and LP=0, multiple channels are converted but the serial port returns to the command mode after one scan of that sequence of channels. When all the channels are read in one scan the Serial Couther & Comparator 720 sets the s.depth bit to logical 1 as shown in FIG. 7, and the conditions change from $\overline{DEPTH}$ to DEPTH. Thus the path out of state 39 to state 0 also occurs under conditions CON*MC*$\overline{LP}$*DEPTH which is shown in FIG. 8D after an isolated plus (along with the condition CON*MC*DEPTH*EXIT which is described below).

Before all the logical channels are read, s.depth is logical zero and conditions include $\overline{DEPTH}$. In this case another 24-bit output word must be read, so the FSM 260 should return to state 16 in the innermost loop. Thus the path from state 39 to state 16 is followed when conditions include both $\overline{DEPTH}$ and MC, as shown in FIG. 8D. At state 16, another load data register signal (!1d.data reg) is generated that is counted by the serial counter and compared, in the Serial Counter & Comparator 720 of FIG. 7, to the value of A determined from the depth pointer bits of the Configuration Register 220. If the serial counter value equals A, then s.depth is set to logical 1 and the condition changes from $\overline{DEPTH}$ to DEPTH.

When MC=1 and LP=1, multiple channels are converted continuously so that serial port stays in the data mode on branching out of state 39. The serial port escapes the data mode to the command mode only when both the full scan has been read (DEPTH) and the exit code has been sent during the clearing of the SDO flag (EXIT). That is, the path from state 39 to state 0 is also followed when the conditions include CON*MC*DEPTH*EXIT, shown in FIG. 8D as the second part of the combined logical expression CON*MC*( LP*DEPTH+DEPTH*EXIT) after an isolated plus. The other conditions that return to the command mode, state 0, from state 39, shown in FIG. 8D before the isolated plus, were described above.

If the user did not issue the exit code during the eight serial clocks that clear the SDO flag, the conditions include $\overline{EXIT}$, and after the complete scan is read, at which time the conditions include DEPTH, the FSM 260 should return to state 8 to prepare to clear another SDO flag with the next eight clocks of SCLK and then read another scan of data conversions. Thus the path from state 39 to state 8 also is followed when the conditions include CON and LP and $\overline{EXIT}$ and DEPTH which is shown in FIG. 8D as the second part of the logical expression CON*LP*$\overline{EXIT}$*( $\overline{MC}$+DEPTH),

Synchronizing a Digital Filter

When a scan is to be converted as the result of a user command to convert, either a single scan or continuously, the user may be implicitly instructing the chip to start and stop a digital filter contained among the programmable ADC components 105. The filter operates on a bit stream synchronized to the device clock which, in general, is different than the serial clock, and which often generates pulses at a lower frequency. Thus the branching of the serial FSM 260 must be synchronized with the operation of the filter using the device clock. This synchronization is accomplished with the done and d.depth bits of the Serial Port Controller 120 shown in FIG. 7 and the Red Convert bit, RC, of the Configuration Register 220, e.g., in position D16 of the preferred embodiment depicted in FIG. 5B.

When RC=1, the filter is to wait for he user to finish reading all words of one scan through the serial port before beginning the conversion of the next scan. When RC=0, the filter begins converting the next scan on the first device clock pulse after the first scan is written to the Conversion Data Registers, regardless of whether the first scan has been read. The done bit is set to logical 1 as the last bit of each word is written to the Conversion Data Registers, regardless of whether the first scan has been read. The done bit is set to logical 1 as the last bit of each word is written to the Conversion Data Registers 250. On the next device clock, the device counter of the Device Counter & Comparator 710 of FIG. 7 is incremented and the done bit is reset to zero. When the device counter equals the value of A, the depth of the sequence of logical channels on a scan, d.depth is set to logical 1 on the next device clock pulse. The counter is reset on the next done condition. The next time the digital filter is started, when new conversion command is issued by the user through the serial port, the d.depth counter is reset and the process repeats. Thus, the start of the filter must be synchronized by th Serial Port controller 120. In the following, the condition D.DEPTH represents the value of d.depth and is distinguished from DEPTH which represents the value of s.depth. The condition DONE represents the value of the done bit.

If RC=1, then the Serial Port Controller 120 may have to set conditions that cause the filter to stop as soon as the data are ready for reading, e.g., when the SDO pin voltage first falls to low level, logical zero. Then the Serial Port Controller may have to set conditions that cause the filter to start when the last bit of the last word of a scan has been transferred. Whether additional conditions are required depends on the values of MC and LP and may depend on the value of s.depth. If RC=0, then the filter starts as soon as the last conversion is done and while there still is another conversion to perform. Whether there is another conversion to perform depends on the values of MC and LP and may depend on d.depth.

If MC=0 and LP=0, then single conversion is performed on a single logical channel. In this case, the filter is started after receiving a command byte to convert, whether RC=0 or 1. That is, the start filter state of the device logic circuit is reached on the first device clock when the conditions include $\overline{MC}$ and $\overline{LP}$ when the serial FSM 260 is at state 7 and CON. This is shown in the first two lines of Table 1 (excluding the column headings).

command byte to convert, and again as soon as the done bit is set from the first conversion of the single logical channel. That is, the start filter state of the device logic circuit is reached on the first device clock when the conditions include $\overline{MC}$ and $\overline{RC}$ and either when DONE or when FSM 260 is branching out of state 7 and CON. This is shown in the third line of Table 1 (excluding the column headings).

If the conversion is to continue only after the bits are read through the serial port, then RC=1. In this case, the filter is started after receiving a command byte to convert, and again on branching out of state 39, after a word is read, before an exit continuous conversion condition occurs. That is, the start filter state of the device logic circuit is reached on the first device clock when the conditions include $\overline{MC}$ and LP and RC when either the FSM 60 is branching out of state 7 and CON, or the FSM 260 is branching out of state 39 and $\overline{EXIT}$ and CON. This is shown in the fourth line of Table 1 (excluding the column headings).

If MC=1 and LP=0, then a single conversion is performed on multiple logical channels. In this case, whether RC=0 or 1, the filter is started after receiving a command byte to convert, as before, and also if an individual channel had been converted while all A channels in the sequence are still not finished. That is, the start filter state of the device logic circuit is reached on the first device clock when the conditions include MC and $\overline{LP}$ and either D $\overline{DEPTH}$ and DONE or the serial FSM 260 is branching out of state 7 and CON. This is shown in the fifth and sixth lines Table 1 (excluding the column headings).

As can be seen in Table 1, if a single conversion is being done, i.e., when LP is zero, it does not matter what the value of RC is. In these cases, the filter starts and stops on the same conditions no matter the value of RC. Effectively, RC is ignored when LP is at logical zero, as stated in FIG. 5B.

Finally, if MC=1 and LP=1, then continuous conversions are performed on multiple logical channels. If the conversion is to continue independently of whether the bits were read out through the serial port, then RC=0. In this case, the filter is started after receiving a command byte to convert,

TABLE 1

Conditions For Starting a Digital Filter

| mode | MC | LP | RC | device clock checks | serial clock checks |
| --- | --- | --- | --- | --- | --- |
| single convert single channel | 0 | 0 | 0 | — | CON*St7 |
| single convert single channel | 0 | 0 | 1 | — | CON*St7 |
| cont. convert single channel | 0 | 1 | 0 | DONE | CON*St7 |
| cont. convert single channel | 0 | 1 | 1 | — | CON*(St7 + $\overline{EXIT}$*St39) |
| single convert mult. channels | 1 | 0 | 0 | $\overline{D.DEPTH}$*DONE | CON*St7 |
| single convert mult. channels | 1 | 0 | 1 | $\overline{D.DEPTH}$*DONE | CON*St7 |
| cont. convert mult. channels | 1 | 1 | 0 | DONE | CON*St7 |
| cont. convert mult. channels | 1 | 1 | 1 | $\overline{D.DEPTH}$*DONE | CON*(St7 + $\overline{EXIT}$*St39*DEPTH) |

If MC=0 and LP=1, then continuous conversion is performed on a single logical channel. If the conversion is to continue independent of whether the bits were read, then RC=0. In this case the filter is started after receiving a and again as soon as the done bit is set from each conversion of each logical channel. That is, the start filter state of the device logic circuit is reached on the first device clock when the conditions include MC and LP and $\overline{RC}$ DONE or when the FSM 260 is branching out of state 7 and CON. This shown in the seventh line of Table 1 (excluding the column headings).

If the conversion is to continue only after all the bits are read through the serial port, then RC=1. In this case, the filter is started after receiving a command byte to convert, and again on branching out of state 39, after all A words of a scan are read so that s.depth is set to 1, before an exit continuous conversion condition occurs. That is, the start filter state of the device logic circuit is reached on the first device clock when the conditions include MC and LP and RC and either $\overline{\text{D.DEPTH}}$ and DONE, or when CON and either the FSM 260 is branching out of state 7 or the FSM 260 is branching out of state 39 and $\overline{\text{EXIT}}$ and DEPTH. This is shown in the eighth line of Table 1 (excluding the column headings).

As described above and shown in the third and seventh rows of Table 1, during continuous conversion (LP=1) without waiting for reads (RC=0), the filter of the ADC components is automatically started as soon the previous conversion is done (i.e., when DONE). Even in these conditions, the filter should stop when the user issues an exit code in the exit flag (the condition is EXIT) and then issues enough clock pulses to reach the end of the scan. The end of the scan is reached the first time the FSM exits out of state 39 if thee is only one channel being converted, i.e., when MC=0 (the condition is $\overline{\text{MC}}$). If MC=1, the end of the scan is reached when the FSM branches out of state 39 and all channels could have be read (the condition is DEPTH). Thus a filter stop command occurs when LP*RC*EXIT*St39*($\overline{\text{MC}}$+DEPTH).

When issuing commands for device components, like the filter, which operate on the device clock, using states set by the serial clock, like the FSM 260, a synchronization block is needed. The synchronization block holds the condition responding to the aerial clock until the next rising edge of the device clock. Such a synchronization block is needed with the start filter and stop filter commands described above.

Use of Pointers

Any time a calibration command is issued (CB=1 and proper CC3–CC0 bits set) or any time a normal conversion command is issued (CB=1, CC2=CC1=CC0=0, MC=0), the bits D6–D3 (or CPB3–CPB0) in the command byte are used as pointers to address one of the logical channels in the channel-setup registers (CSRs). In the preferred embodiment, the channel setup registers require more bits than the command; the command only requires one byte. These pointers greatly increase the efficiency of the user command interface. Table 2 details the logical channel the pointer bits address. Note that for devices with 4 physical channels, D6–D3 (or CPB3–CPB0) can only be 0000–0111 (8 logical channels). For the devices with 2 physical channels, D6–D3 can only be 0000–0011 (4 logical channels).

EXAMPLES

Five example situations that a user might encounter when acquiring a conversion or calibrating the converter follow. These examples assume that the user is using a device with 8 physical channels (16 logical channels) and that its CSRs are programmed with the following physical channel order: 6,1,6,2,6,3,6,4,6,5,6,2,6,7,6,8.

TABLE 2

Relationship between pointer bits CPB and logical channels.

| D6-D3 (CPB3-CPB0) | CSR Address | Logical Channel |
|---|---|---|
| 0000 | CSR #1 | $1^{st}$ |
| 0001 | CSR #1 | $2^{nd}$ |
| 0010 | CSR #2 | $3^{rd}$ |
| 0011 | CSR #2 | $4^{th}$ |
| 0100 | CSR #3 | $5^{th}$ |
| 0101 | CSR #3 | $6^{th}$ |
| 0110 | CSR #4 | $7^{th}$ |
| 0111 | CSR #4 | $8^{th}$ |
| 1000 | CSR #5 | $9^{th}$ |
| 1001 | CSR #5 | $10^{th}$ |
| 1010 | CSR #6 | $11^{th}$ |
| 1011 | CSR #6 | $12^{th}$ |
| 1100 | CSR #7 | $13^{th}$ |
| 1101 | CSR #7 | $14^{th}$ |
| 1110 | CSR #8 | $15^{th}$ |
| 1111 | CSR #8 | $16^{th}$ |

Example 1

The configuration register has the following bits as shown: DP3–DP0='1001', MC=1, LP=1, RC=0. The command byte issued is '1XXXX000' where the X bits are not relevant for the present illustration. These settings instruct the converter to repeatedly perform multiple conversions on ten logical channels. The order which the channels are converted is: 6,1,6,2,6,3,6,4,6,5. SDO falls after physical channel 5 is converted. To acquire the 10 conversions, 8 SCLKs with SDI=0 are required to read the conversion data from the FIFO. The order in which the data is provided is the same as the order in which the channels are converted. The first 3 bytes of data correspond to the first logical channel which in this example is physical channel 6; the next 3 bytes of data correspond to the second logical channel which in this example is physical channel 1; and, the last 3 bytes of data corresponds to 10th logical channel which here is physical channel 5. Since the logical channels are converted in the background, while the data is being read, the user must finish reading the conversion data FIFO before it is updated with the new conversions. To exit this conversion code the user must provide "11111111" to SDI during the first 8 SCLKs. If a byte of 1's is provided, the serial port returns to the command mode only after the conversion data FIFO is emptied (in this case 10 conversions are acquired) Note that in this example physical channel 6 is converted five times.

Each conversion could be with the same or different filter rates depending on the setting of logical channels 1, 3, 5, 7 and 9. Note that there is only one offset and one gain register per physical channel. Therefore, any physical channel can only be calibrated for the gain range selected during calibration. Specifying a different gain range in the logical channel setting than the range that was calibrated will result in a gain error.

Example 2

The configuration register has the following bits as shown: DP3–DP0='0101', MC=1, LP=0, RC=X. The command issued is "1XXXX000". These settings instruct the converter to perform a single conversion on six logical channels once. The order in which the channels are converted is 6, 1, 6, 2, 6, and 3. SDO falls after physical channel 3 is converted. To acquire the 6 conversions 8 SCLKs are required to clear the SDO flag. Then 144 additional SCLKs are required to get the conversion data. Again, the order in which the data is provided is the same as the order in which the channels are converted. After the last 3 bytes of the conversion data corresponding to physical channel 3 is read, the serial port automatically returns to the command mode where it will remain until the next valid command byte is received.

Example 3

The configuration register has the following bits as shown: DP3–DP0="XXX", MC=0, LP=1, RC=1. The command byte issued is "10011000". These settings instruct the converter to repeatedly convert the fourth logical channel as CPB3–CPB0="0011" (which happens to be physical channel 2 in this example). SDO falls after physical channel 2 is converted. To acquire the conversion 32 SCLKs are required. The first 8 SCLKs are needed to clear the SDO flag. As in Example 1, if "00000000" is provided to the SDI pin during the first 8 SCLKs, the conversion is performed again on physical channel 2. The converter will remain in data mode until "11111111" is provided during the first 8 SCLKs following the fall of SDO. After "11111111" is provided, 24 additional SCLKs are required to transfer the last 3 bytes of conversion data before the serial port will return to the command mode.

Example 4

The configuration register has the following bits as shown: DP3–DP0="XXXX", MC=0, LP=0, RC=X. The command issued is "11110000". These settings instruct the converter to convert the 15$^{th}$ logical channel once, as CPB3–CPB0="1110" (which happens to be physical channel 6 in this example). SDO falls after physical channel 6 is converted. To read the conversion, 32 SCLKs are then required. Once acquired, the serial port returns to the command mode.

Example 5

The configuration register has the following bits as shown: DP3–DP0="XXXX", MC=X, LP=X, RC=X. The command issued is "1-1-1-11-1". These settings instruct the converter to perform a system offset calibration of the 6$^{th}$ logical channel (which is physical channel 3 in this example). During calibration the serial port remains in the command mode. Once the calibration is completed, SDO falls. To perform additional calibrations more commands have to be issued.

System Using ADC Chip for Continuous Conversion

The Configuration Register 220 must be written before Channel-Setup Register 240 because the depth information contained in the Configuration Register 220 defines how many of the CSRs to use. The CSRs need to be written irrespective of single conversion or multiple single conversion or multiple continuous conversion mode. When single channel conversions (MC=0) are desired, the logical channel address is embedded in the command byte. In the multiple channel, single conversion mode (MC=1), channels are selected in a preprogrammed order based on information contained in the CSRs and the depth bits (DP3–DP0) of the configuration register.

Once the CSRs are programed, multiple channel conversions on up to 16 logical channels per scan can be performed by issuing only one command byte in the preferred embodiment. The single conversion mode also requires only one command, but whenever another or a different single conversion is desired, this command or a modified version of it has to be performed again. The NULL command is used to keep the serial portion command mode, once it is in command mode.

Figure 10C:
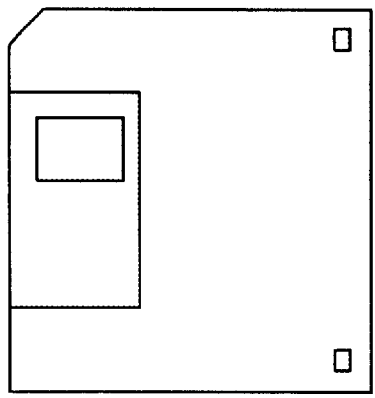
FIG. 10C is a plan view of an exemplar storage medium for use in the computer of FIG. 10B.
Figure 10A:
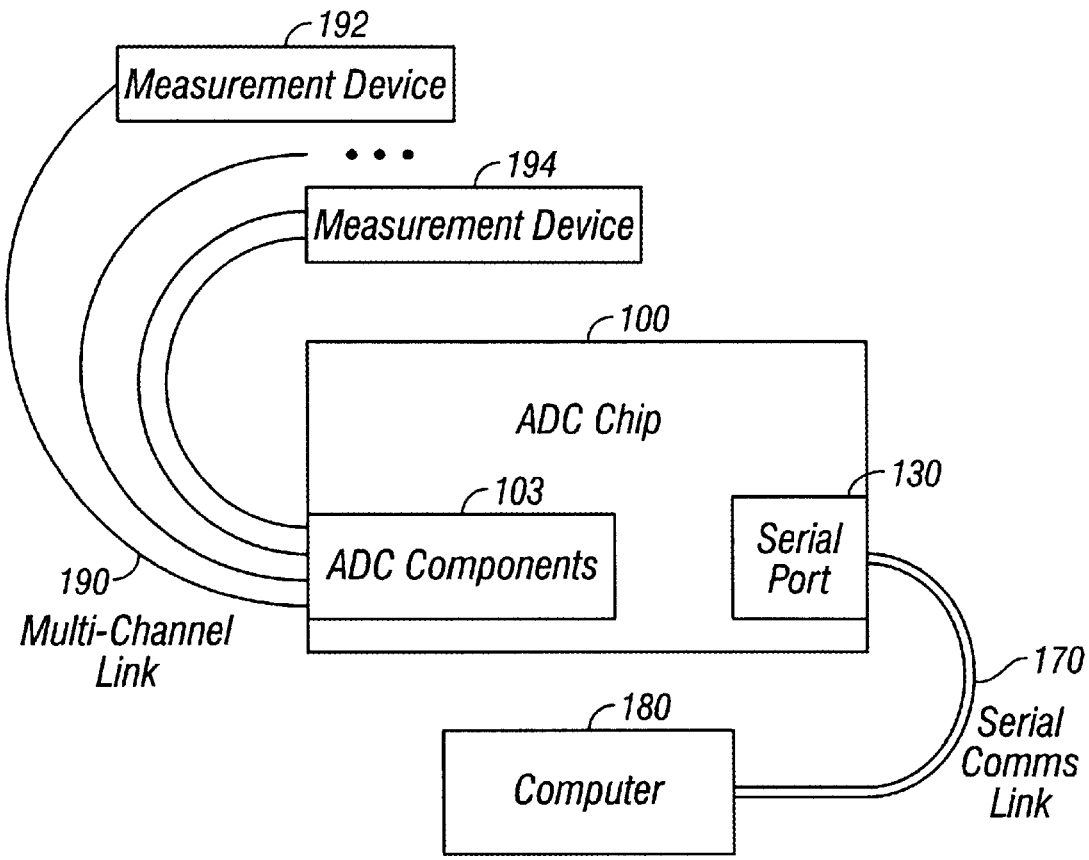
FIG. 10A is a block diagram of a system according to one embodiment of the present invention.

A system using the chip 100, according to another embodiment of the invention is depicted in FIG. 10A. The system includes the chip 100 with the plurality of physical channels 103 and the serial port 120. The multiple physical channels are connected to one or more measurement devices, e.g., 192, 194, through any multi-channel communications link 190 known in the art. Such multi-channel links include multi-strand cables, frequency multiplexed electrical and optional signals travelling on electrical cables and optical fibers, frequency multiplexed electromagnetic and acoustic signals, including infrared and radio wave transmissions. The serial port 130 is connected through a serial communications link 170 to an external processor, such as a microprocessor or a computer 180. In one embodiment, the computer 180 issues the user signals on the SCLK pin, the CS pin and the SDI pin of the serial port interface.

Figure 10B:
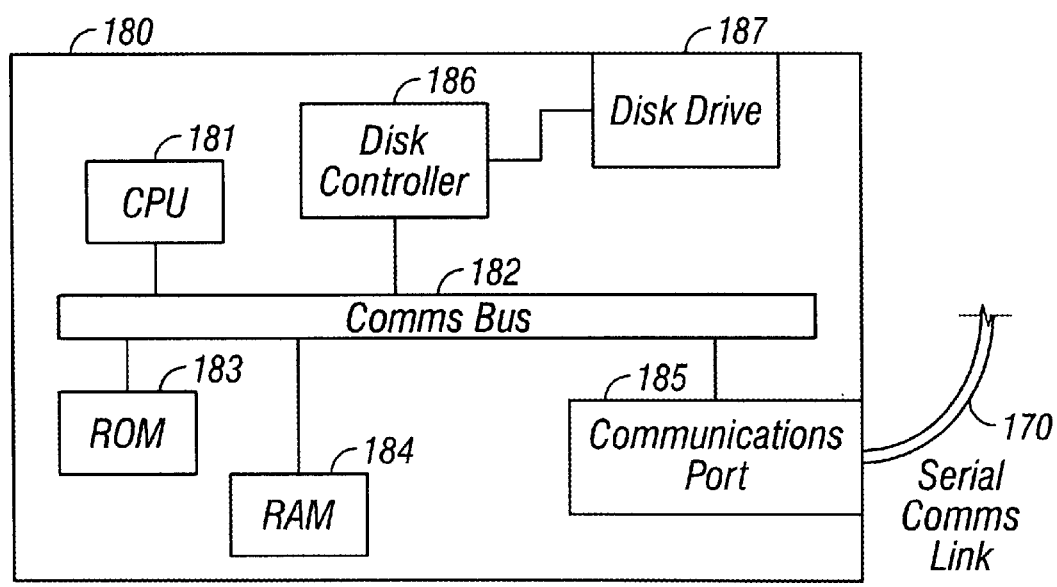
FIG. 10B is a block diagram of the computer of FIG. 10A.

As shown in FIG. 10B, the computer includes a central processing unit (CPU) 181 connected to a computer communications bus 182. The computer communications bus 182 is connected to a communications port 185 which may be connected to the serial communications link 170. The CPU controls the communications port 185 in a manner dictated by CPU instructions in a computer program stored in any computer readable memory medium known in the art. Such memory media include but are not limited to read only memory (ROM) 183 and random access memory (RAM) connected to the bus 182, disks read by a disk drive 187 connected to the bus 182 through a disk controller 186, and other media not shown such as digital video tape. FIG. 10C shows an exemplar removable disk 189 that can be inserted into disk drive 187 and which can serve as the memory medium on which computer controlling instructions are stored.

The invention has been described and illustrated in detail in terms of the preferred embodiments as examples only, and is not limited to the example embodiments. Rather, the spirit and scope of the present invention is limited only by the terms of the appended claims and their equivalents.

What is claimed is:

1. A method for processing a plurality of analog signals on a corresponding plurality of physical channels using a circuit having ADC components, a serial port interface, and a serial port controller, comprising the steps of:

storing a plurality of logical channels in a register on a serial port controller, each logical channel including information specifying one physical channel of a plurality of physical channels and conversion information for controlling ADC components, the number of logical channels being greater than the number of physical channels; and receiving command bits over a serial port interface, the command bits including at least one pointer bit pointing to a selected logical channel of the plurality of logical channels;

retrieving the information in the selected logical channel from the register, and sending signals to the ADC components indicating the physical channel and the conversion information specified in the selected logical channel.

2. The method of claim 1, further comprising receiving additional command bits when any additional logical channel is used for processing.

3. The method of claim 1, wherein the step of storing comprises receiving the information for the plurality of logical channels over the serial port interface, whereby the information in a logical channel is user programmable.

4. The method of claim 1, the plurality of logical channels stored in the register in a first order, the method further comprising, following said step of sending signals to the ADC components:

receiving additional command bits to initiate processing of an additional logical channel, the additional command bits including at least one pointer bit pointing to the additional logical channel, retrieving the information in the additional logical channel from the register, and sending signals to the ADC components indicating the physical channel and the conversion information specified in the additional logical channel, whereby the logical channels are processed in a second order corresponding to the order in which pointer-containing command bits are received.

5. The method of claim 1, wherein the number of logical channels is double the number of physical channels.

6. A serial port controller circuit for controlling ADC components using a serial port interface, the circuit comprising a register for storing a plurality of logical channels, each logical channel specifying one physical channel of a plurality of physical channels and conversion information for controlling ADC components, the number of logical channels being greater than the number of physical channels, and a processor connected to the register, to the ADC components, and to a serial port interface, the processor configured to receive command bits, the command bits including at least one pointer bit pointing to a selected logical channel of the plurality of logical channels, to retrieve information in the selected logical channel from the register, and to send signals to the ADC components indicating the physical channel and the conversion information specified in the selected logical channel.

7. The serial port controller circuit of claim 6, the plurality of logical channels stored in said register in a first order, said processor further configured to:

receive additional command bits to initiate processing of an additional logical channel, the additional command bits including at least one pointer bit pointing to the additional logical channel, retrieve the information in the additional logical channel from the register, and send signals to the ADC components indicating the physical channel and the conversion information specified in the additional logical channel, whereby the logical channels are processed in a second order corresponding to the order in which pointer-containing command bits are received, whereby the logical channels are processed in a second order corresponding to the order in which pointer-containing command bits are received.

8. A system for processing multiplexed analog signals from measurement devices, the system comprising:

a plurality of physical channels for receiving at least one analog signal, an ADC circuit connected to the plurality of physical channels, said circuit controlled by a conversion information signal, for converting an analog signal on a selectable one of the plurality of physical channels to a digital sample;

a communications bus connected to the ADC circuit;

a serial port interface for receiving command bits, the command bits including at least one pointer bit pointing to a selected logical channel of a plurality of logical channels, the number of logical channels being greater than the number of physical channels; and a serial port controller connected to the communications bus, and the serial port interface, the controller comprising a register for storing the plurality of logical channels, each logical channel including information specifying one physical channel of the plurality of physical channels and conversion information, and a processor connected to the register, to the ADC components, and to the serial port interface, the processor configured to receive the command bits, to retrieve information in the selected logical channel from the register, and to send the conversion information signal to the ADC components indicating the physical channel and the conversion information specified in the selected logical channel.

9. The system of claim 8, wherein a number of bits of the at least one pointer bit is less than a number of bits each logical channel, whereby more bits of information are accessed by fewer bits.

10. The system of claim 9, further comprising a computer connected to the serial port interface for issuing the command bits to the serial port interface.

11. The system of claim 10, wherein:

the serial port controller further comprises at least one conversion data register, for storing the digital sample, and the processor is further configured to output bits from the at least one conversion data register over the serial port interface to the computer.

12. The system of claim 8, the plurality of logical channels stored in said register in a first order, said processor further configured to:

receive additional command bits to initiate processing of an additional selected logical channel, the additional command bits including at least one pointer bit pointing to the additional selected logical channel, retrieve the information in the additional selected logical channel from the register, and send signals to the ADC components indicating the physical channel and the conversion information specified in the additional selected logical channel, whereby the logical channels are processed in a second order corresponding to the order in which pointer-containing command bits are received.

13. A program product for a serial port controller having a processor, the controller connected to an ADC circuit and a serial port interface, comprising:

a memory medium; and processor controlling instructions, stored on the memory medium, for storing a plurality of logical channels in register on the serial port controller, each logical channel including information specifying one physical channel of a plurality of physical channels and conversion information, the number of logical channels being greater than the number of physical channels;

for receiving command bits over a serial port interface, the command bits including at least one pointer bit pointing to a selected logical channel of the plurality of logical channels, and for sending to an ADC circuit a conversion information. signal indicating the physical channel and the conversion information specified in the selected logical channel.

14. The program product of claim 13, further comprising processor controlling instructions, stored on the memory medium, for receiving additional command bits and sending additional conversion information signals when any additional logical channel is used for processing.

15. The program product of claim 13, further comprising processor controlling instructions, stored on the memory medium for receiving the information for the plurality of logical channels over the serial port interface before said storing, whereby the information in a logical channel is user programmable.

16. The program product of claim 15, further comprising processor controlling instructions, stored on the memory medium, wherein the command bits selectably include at least one write register bit indicating that one of the plurality of logical channels is received next over the serial port interface, before receiving at least one logical channel.

17. The program product of claim 13, the plurality of logical channels stored in said register in a first order, said processor controlling instructions further comprising instructions:

for receiving additional command bits to initiate processing of an additional logical channel, the additional command bits including at least one pointer bit pointing to the additional logical channel, for retrieving the information in the additional logical channel from the register, and send signals to the ADC components indicating the physical channel and the conversion information specified in the additional logical channel, whereby the logical channels are processed in a second order corresponding to the order in which pointer-containing command bits are received.

18. The computer program product for a computer connected via a serial port of an ADC chip having a serial port controller, the computer program product comprising:

a computer readable memory medium; and computer controlling instructions, stored on the computer readable memory medium, for setting command bits over a serial port interface, the command bits including at least one pointer bit pointing to a selected logical channel of a plurality of logical channels, wherein a serial port controller connected to the serial part interface stores information in the plurality of logical channels in a register, and, in response to the command bits, retrieves from the register the information specifying a physical channel and conversion information specified in the selected logical channel, and sends to ADC components conversion information signals indicating the physical channel and conversion information, the number of logical channels being greater than a number of physical channels.

19. The computer program product of claim 18, wherein a number of bits of the at least one pointer bit is less than a number of bits of each logical channel, whereby more bits of information are accessed by fewer bits.

20. The computer program product of claim 17, further comprising computer controlling instructions, stored on the memory medium, for sending the plurality of logical channels over the serial port interface before setting the command bits whereby the information in a logical channel is user programmable.

21. The computer program product of claim 20, further comprising computer controlling instructions, stored on the memory medium, for first setting in the command bits at least one write register bit indicating that one of the plurality of logical channels will be next provided over the serial port interface, before sending at least one logical channel over the serial port interface.

22. A method of designing an integrated circuit for controlling ADC components using a serial port interface, the method comprising;

providing a register for storing a plurality of logical channels, each logical channel including information specifying one physical channel of a plurality of physical channels and conversion information, the number of logical channels being greater than the number of physical channels, providing connections to a communications bus for communication with ADC components connected to the plurality of physical channels, providing a serial port interface for receiving command bits, the command bits including at least one pointer bit pointing to a selected logical channel of the plurality of logical channels, and providing a processor connected to the register, the serial port interface, and the communications bus, the processor configured to retrieve the information in the selected logical channel from the register, and to send signals indicating the physical channel and the conversion information specified in the selected logical channel over the communication bus to the ADC components.

23. A method of manufacturing an integrated circuit for controlling ADC components using a serial port interface, the method comprising:

providing a register for storing a plurality of logical channels, each logical channel including information specifying one physical channel of a plurality of physical channels and conversion information the number of logical channels being greater than the number of physical channels, providing connections to a communications bus for communication with ADC components connected to the plurality of physical channels, providing a serial port interface for receiving command bits, the command bits including at least one pointer bit pointing to a selected logical channel of the plurality of logical channels, and providing a process or connected to the register, the serial port interface, and the communication bus, the processor configured to retrieve the information in the selected logical channel from the register, and to send signals indicating the physical channel and the conversion information specified in the selected logical channel over the communications bus to the ADC components.

* * * * *